(12) United States Patent
Asai et al.

(10) Patent No.: US 7,834,461 B2
(45) Date of Patent: Nov. 16, 2010

(54) SEMICONDUCTOR APPARATUS

(75) Inventors: Shuji Asai, Kanagawa (JP); Tadachika Hidaka, Shiga (JP); Naoto Kurosawa, Kanagawa (JP); Hirokazu Oikawa, Kanagawa (JP); Takaki Niwa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 498 days.

(21) Appl. No.: 11/853,196

(22) Filed: Sep. 11, 2007

(65) Prior Publication Data

US 2008/0073752 A1    Mar. 27, 2008

(30) Foreign Application Priority Data

Sep. 27, 2006    (JP) .............................. 2006-262082

(51) Int. Cl.
*H01L 23/48*    (2006.01)
*H01L 23/52*    (2006.01)

(52) U.S. Cl. ........................ 257/774; 257/751; 257/766; 257/769; 257/E23.011

(58) Field of Classification Search ................. 257/774, 257/E23.011, 751, 766, 769
See application file for complete search history.

(56) References Cited

U.S. PATENT DOCUMENTS

| | | | | |
|---|---|---|---|---|
| 4,617,730 A | * | 10/1986 | Geldermans et al. .......... | 29/843 |
| 5,496,755 A | * | 3/1996 | Bayraktaroglu ............. | 438/167 |
| 5,511,428 A | * | 4/1996 | Goldberg et al. ............. | 73/777 |
| 5,949,140 A | * | 9/1999 | Nishi et al. .................. | 257/728 |
| 6,124,179 A | * | 9/2000 | Adamic, Jr. ................. | 438/309 |
| 6,914,336 B2 | * | 7/2005 | Matsuki et al. ............. | 257/769 |
| 6,921,718 B2 | * | 7/2005 | Andoh et al. ............... | 438/699 |
| 2005/0017333 A1 | * | 1/2005 | Bohr .......................... | 257/678 |
| 2005/0189588 A1 | | 9/2005 | Ma et al. | |
| 2005/0200027 A1 | * | 9/2005 | Sinha et al. ................. | 257/774 |
| 2005/0205997 A1 | * | 9/2005 | Yamamoto et al. .......... | 257/751 |
| 2006/0027934 A1 | * | 2/2006 | Edelstein et al. ............ | 257/774 |

FOREIGN PATENT DOCUMENTS

| JP | 60-134483 A | 7/1985 |
|---|---|---|
| JP | 3-99470 A | 4/1991 |
| JP | 8-46042 A | 2/1996 |
| JP | 2004-128352 A | 4/2004 |

* cited by examiner

*Primary Examiner*—Nitin Parekh
(74) *Attorney, Agent, or Firm*—Sughrue Mion, PLLC

(57) ABSTRACT

A semiconductor apparatus includes a semiconductor device formed to a first surface of a semiconductor substrate, a blocking film provided in a first via-hole, the first via-hole formed with a concave shape to the first surface of the semiconductor substrate, a first via line connected to an electrode of the semiconductor device in contact with the blocking film, a second via line formed inside a second via-hole, electrically connected with the first via line with the blocking film interposed therebetween and being apart of a wiring formed to a second surface, the second via-hole formed with a concave shape to the second surface opposing the first surface of the semiconductor substrate so as to reach the blocking film. The blocking film includes at least one kind of group 8 element.

14 Claims, 18 Drawing Sheets

RELATED ART

RELATED ART

RELATED ART

RELATED ART

SEMICONDUCTOR APPARATUS

BACKGROUND OF THE INVENTION

1. Field of the Invention

The present invention relates to a semiconductor apparatus, and particularly to a semiconductor apparatus having a double-sided substrate via-hole for an electric connection formed by trenching from both sides of the semiconductor substrate.

2. Description of Related Art

For a semiconductor apparatus especially a semiconductor chip of an analog integrated circuit processing high-frequency transistors and signals, a substrate via-hole is generally used as a ground line instead of wire bonding. The substrate via-hole is a ground line of a semiconductor device formed on the surface of the substrate. The substrate via-hole is formed by providing a through-hole to a semiconductor substrate and a line given with metal plating. For the wire bonding, a flexion of the wire is an inductive component and a diameter of the wire is a resistance component. Thus a ground potential on the semiconductor chip becomes unstable and a high-frequency performance is hard to obtain. Then, by connecting the ground plane of the backside with a semiconductor device formed to the surface using a thicker and shorter line through the substrate via-hole, the inductor and resistance component are suppressed and the semiconductor chip is connected to ground. This improves the high-frequency performance of the semiconductor apparatus.

The substrate via-hole is made by forming a trench in a semiconductor substrate by an etching and forming metal plating in the trench. The method to provide the trench is broadly divided into 3 methods. The first method is to form a trench on the surface where a semiconductor device is provided. A substrate via-hole formed by the first method is referred to as a surface substrate via-hole. The second method is to form a trench on the backside of the semiconductor substrate. A substrate via-hole formed by the second method is referred to as a backside substrate via-hole. The third method is to form a trench from both sides of the semiconductor substrate. A substrate via-hole formed by the third method is referred to as a double-sided substrate via-hole.

The oldest among these via-holes is the backside substrate via-hole. An etching for a semiconductor substrate is initially a wet type using a solution. A wet etching is performed by an undercut with isotropic etching from a photoresist film mask. The cross-sectional shape of the trench is trapezoid. Thus an aperture area of the surface side is narrower than the opening of the backside. In the backside substrate via-hole, a photoresist film as an etching mask is provided on the backside of the substrate. Hence, the backside substrate via-hole requires a special backside photolithography apparatus to align the etching mask for the photoresist film formed to the backside side according to a marking on the surface side.

After that, a high-speed dry etching technique using high-density plasma has been developed that enables to trench a semiconductor substrate to a vertical shape. The surface substrate via-hole can be formed from the surface side. The surface substrate via-hole becomes to be used. To form a surface substrate via-hole, the special backside photolithography apparatus is not necessary. The via-hole is formed using a common stepper photolithography apparatus. That is, the via-hole is formed based on a pattern of a photoresist film mask formed to the surface. However, if a ratio (selectivity) between the thickness of the photoresist etched by a dry etching and thickness of the area in the semiconductor chip to be etched is low, a photoresist film is needed to be thicker than the thickness of the semiconductor substrate. In such case, there has been a problem that the thickness of the photoresist film causes to deteriorate resolution of the opening pattern and it is difficult to provide a fine opening.

A combination of the two via-holes is the double-sided substrate via-hole. For the surface side, a photoresist film with a thickness to obtain fine resolution is used. A substrate is etched by a dry etching to the halfway of the substrate, and metal plating is provided. Furthermore, a trench is provided from the backside with relaxed accuracy. Then a ground line formed in the trench from backside is connected with a line formed in the trench from the surface side. That is, there is a problem in the double-sided substrate via-hole that the number of processes and processing period increase as it requires processes from surface and backside. However the double-sided substrate via-hole enables to trench from the surface side with high accuracy, thus it is able to increase the density of the semiconductor chip.

In a wet etching of a semiconductor substrate, a mixed solution of hydrogen peroxide solution and acid or alkali is used. In this method, firstly hydrogen peroxide solution oxidizes semiconductor crystal. The oxide is dissolved by acid or alkali. For the acid, hydrofluoric acid is used when the semiconductor is Si. On the other hand, when the semiconductor is a compound such as GaAs or InP, sulfuric acid or phosphoric acid or the like is used. However when the temperature rises due to reaction heat of an etching, there is a problem that the adherence of the photoresist film is reduced and the undercut proceeds. Therefore, it is necessary to dilute the acid by water to suppress the etching rate.

In the meantime, in a dry etching of a semiconductor substrate, chlorine (Cl) or bromine (Br) gas is used. In etchings initially, a parallel plate type RIE (Reactive Ion Etching) has been used. After that, in order to increase the etching rate, a high-density plasma type dry etching apparatus has been developed. The high-density plasma type apparatus is broadly categorized as ECR (Electron Cyclotron Resonance) that uses electron cyclotron resonance microwave or ICP (Inductively Coupled Plasma) which is an inductively coupled discharge system. Furthermore, by a method to forcibly cooling a substrate mount using He gas, a high-speed and vertical dry etching was made possible.

However by a chlorine gas etching, semiconductor such as Si, GaAs and InP can be etched at high-speed but there is also a disadvantage that Al, Au and Cu or the like as a line metal is etched. This means that when providing these line metals to the trench of the surface side using a double-sided substrate via-hole and performing a chlorine dry etching from the backside, the line metals provided to the surface side in advance are also etched.

As a related art 1, Japanese Unexamined Patent Application Publication No. 60-134483 discloses a FET (Field Effect Transistor) having a double-sided substrate via-hole. FIGS. 19A and 19B are a top view and cross-sectional diagram showing the structure of the field-effect transistor having a double-sided substrate via-hole. FIG. 19A is a top view of the field-effect transistor and FIG. 19B is a cross-sectional diagram of the field-effect transistor. As shown in FIG. 19B, for the field-effect transistor according to the related art 1, the backside of the lower part of the active layer region 102 for FET that is provided to the surface of the GaAs substrate 101 is trenched to be trapezoid shape (cross-section 110). The trench is formed from one end of the GaAs substrate 101 to reach another end to be strip shape. The portion the trench formed is thinner than the other portion the trench unformed. A ground electrode 109 is provided to the entire backside surface. In an assembling process, when the GaAs substrate 101 is mounted to a metal base, a brazing filler material gets into the trench on the backside and the trench is filled. By this, the field-effect transistor according to the related art 1 reduces the substrate thickness in the heating FET active layer region to reduce the thermal resistance of the region. A source electrode 107 is pulled out in horizontal direction to provide a pad portion. There is a substrate via-hole 108 under the pad portion. The substrate via-hole 108 is connected with the ground electrode 109 in the thinner area the trench formed of the backside of the substrate.

On the other hand, a gate electrode 103 and a drain electrode 104 are taken out over the semi-insulating GaAs substrate 101, which is not trenched and still thick. A gate electrode 103 and a drain electrode 104 is to be the matching circuit 105. Furthermore, a bonding pad 106 is provided to the gate electrode 103 and drain electrode 104. As the substrate of the matching circuit 105 is thick, there is only a small loss. For the matching circuit 105, a line is formed to be tapered (tapered portion 112) corresponding to the slope of a cutting tapered portion 111. This keeps an impedance of the matching circuit 105 to be constant, thereby not losing consistency.

As a related art 2, a manufacturing method of a semiconductor apparatus according to a related art is disclosed Japanese Unexamined Patent Application Publication No. 3-99470. FIGS. 20A to 20D are cross-sectional diagrams illustrating processes to manufacture a double-sided substrate via-hole unit according to the related art 2. In FIGS. 20A to 20D, the semiconductor apparatus in related art includes a GaAs substrate 121, first via-hole 122, second via-hole 123, first via-hole inner metal layer 124, foundation electroless nickel plating layer 125, photoresist layer 126, electroless nickel plating layer 127, electrolytic Au plating layer 128 and projection cutting portion 181.

As shown in FIG. 20A, the first via-hole 122 of approx 30 μm is formed by RIE method or the like from a first surface of the GaAs substrate 121. Inside the via-hole 122, the metal layer 124 is formed by electrolytic gold (Au) plating. After that, the GaAs substrate 121 is processed to have 100 μm thickness by wrapping and polishing etc. The second via-hole 123 is formed by a chemical etching or the like from a second surface side which is opposite side of the first surface of the GaAs substrate 121. At this time, the second via-hole 123 is formed so that the bottom of the metal layer 124 inside the first via-hole 122 is exposed.

Then proceed to the process shown in FIG. 20B. In this process, a palladium (Pd) activation is performed to entire second surface of the GaAs substrate 121 including the inner surface of the second via-hole 123. An electroless nickel (Ni) is plated to form the foundation electroless nickel plating layer 125. By photolithography, the entire second surface of the GaAs substrate 121 excluding the opening of the second via-hole 123 is masked by the photoresist layer 126 or the like. Without Pd activation, a process is performed with electroless Ni plating solution. Then a chemical reduction is performed with the foundation electroless nickel plating layer exposed inside the second via-hole 123 as a catalyst. By performing the above process, the electroless nickel plating layer 127 is filled (see FIG. 20C). The photoresist layer 126 is removed. To the entire second surface of the substrate 121, the electrolytic Au plating layer 128 is formed. After that, a projection part 181 generated by undulation of the filled layer 127 of the second via-hole 123 is polished and chipped off (see FIG. 20D).

The semiconductor device according to the related art 2 forms the trench of the via-hole by RIE method for the surface side and chemical etching for the backside. The via-hole line is electrolytic gold (Au) plating for the surface side and electroless Ni plating for the backside.

As a related art 3, a method of manufacturing a semiconductor apparatus in related art is disclosed Japanese Unexamined Patent Application Publication No. 2004-128352. FIGS. 21A to 21E are cross-sectional diagrams of the semiconductor apparatus in each process to manufacture a double-sided substrate via-hole unit according to the related art 3. As shown in FIG. 21E, the completed semiconductor apparatus includes a semiconductor substrate 202 formed of GaAs or the like, ohmic electrode 204 formed to a principal surface side of the semiconductor substrate 202, insulating film 206, via-hole foundation electrode with barrier metal 210, via-hole electrode 212 and a backside via-hole electrode 214 formed to the backside of the semiconductor substrate 202. Hereinafter, a manufacturing process of the semiconductor apparatus is described with reference to cross-sectional diagrams for each process.

A first process shown in FIG. 21A is described hereinafter. In the first process, the ohmic electrode 204 is formed over the semiconductor substrate 202 using liftoff method. The insulating film 206 is formed over the ohmic electrode 204 using CVD method. Next, an opening of the contact hole 220 is formed to the insulating film 206 to expose the surface of the ohmic electrode 204.

A second process shown in FIG. 21B is described hereinafter. In the second process, a resist 208 is formed in the area over the ohmic electrode 204 and also inside the contact hole 220. An opening pattern is to be formed to the resist 208. With the resist 208 as a mask, a dry etching such as ion trimming is performed. This exposes the surface of the semiconductor substrate 202. Furthermore, with the resist 208 as a mask, the semiconductor substrate 202 is dry etched to reach a predetermined depth by RIE. This forms a via-hole 226. After that, the resist 208 used as a mask is removed.

A third process shown in FIG. 21C is described hereinafter. In the third process, firstly the resist 208 is reconstituted. The resist 208 is formed so that a part of the via-hole 226 and ohmic electrode 204 are exposed and the insulating film 206 is covered. The barrier metal film 210 such as WSi is deposited to the entire surface of the semiconductor chip. The barrier metal film 210 covers inner wall of the via-hole 226, exposed ohmic electrode 204 and resist 208. Over the barrier metal film 210, a resist (not shown) having an opening pattern wider than an opening pattern of the resist 208 is formed. With the resist as a mask, the via-hole electrode 212 is formed by electrolytic plating method.

A fourth process shown in FIG. 21D is described hereinafter. In the fourth process, firstly the resist formed over the barrier metal film 210 is removed. With the via-hole electrode 212 as a mask, the exposed barrier metal film 210 is removed. The exposed resist 208 is removed. From the backside of the semiconductor substrate 202, a backside via-hole 232 is formed so that the barrier metal film 210 of the bottom of the via-hole 226 is exposed.

A fifth process shown in FIG. 21E is described hereinafter. In the fifth process, to the backside of the semiconductor substrate 202 including the inside of the backside via-hole 232, the backside via-hole electrode 214 is formed by electrolytic plating method. The semiconductor apparatus of the related art 3 is obtained from the above processes.

In the semiconductor apparatus according to a related art 3, the barrier metal film 210 as a foundation of the via-hole electrode 212 on the surface side is WSi and aims to prevent interdiffusion between the via-hole electrode 212 and ohmic electrode 204. Such semiconductor apparatus is disclosed in Japanese Unexamined Patent Application Publication No. 8-46042, which is a related art 4.

As described above, to form a double-sided substrate via-hole by a dry etching using chlorine gas of related art, when etching from the backside side, not only the semiconductor substrate such as GaAs and Si for the via-hole on the backside, wiring materials such as Au, Cu, Al, Ti, Ta, W, Mo, TiN and WSi buried in the via-hole on the surface side is also etched. There is a problem that if the via line buried in the via-hole on the surface side is etched in this way, there is a problem of causing a disconnection of the lines.

SUMMARY

In one embodiment, a semiconductor apparatus includes a semiconductor device formed to a first surface of a semiconductor substrate, a blocking film provided in a first via-hole, the first via-hole formed with a concave shape to the first surface of the semiconductor substrate, a first via line, in contact with the blocking film, that is connected to an electrode of the semiconductor device in contact with the blocking film, a second via line formed inside a second via-hole, electrically connected with the first via line with the blocking film interposed therebetween and being a part of a wiring formed to a second surface, the second via-hole formed with a concave shape to the second surface opposing the first surface of the semiconductor substrate so as to reach the blocking film. The blocking film includes at least one kind of group 8 element.

With the semiconductor apparatus of the present invention, the first and the second via lines are electrically connected with blocking film interposed therebetween. The blocking film includes group 8 element in the periodic table of elements; iron (Fe), cobalt (Co), nickel (Ni), ruthenium (Ru), rhodium (Rh), palladium (Pd), osmium (Os), iridium (Ir) and platinum (Pt) Group 8 element is all metal and exhibits favorable conductivity. After forming the semiconductor device to the first surface (for example the surface of the semiconductor substrate), the concave shaped first via hole (for example surface via-hole) is formed and the first via line (for example surface via line) is formed inside the surface via-hole so that the blocking film is in contact with the surface via-hole. After that, the concave shaped second via-hole (for example backside via-hole) is formed from the opposing second surface and the second via line (for example backside via line or backside electrode) is formed to reach the blocking film formed to the first via line side. This enables the first and the second via lines to be electrically connected with the blocking film which is metal interposed therebetween.

The present invention achieves a structure to definitely manufacture a semiconductor device having a double-sided substrate via-hole.

BRIEF DESCRIPTION OF THE DRAWING

The above and other objects, advantages and features of the present invention will be more apparent from the following description of certain preferred embodiments taken in conjunction with the accompanying drawings, in which.

DESCRIPTION OF THE PREFERRED EMBODIMENTS

Figure 1A:
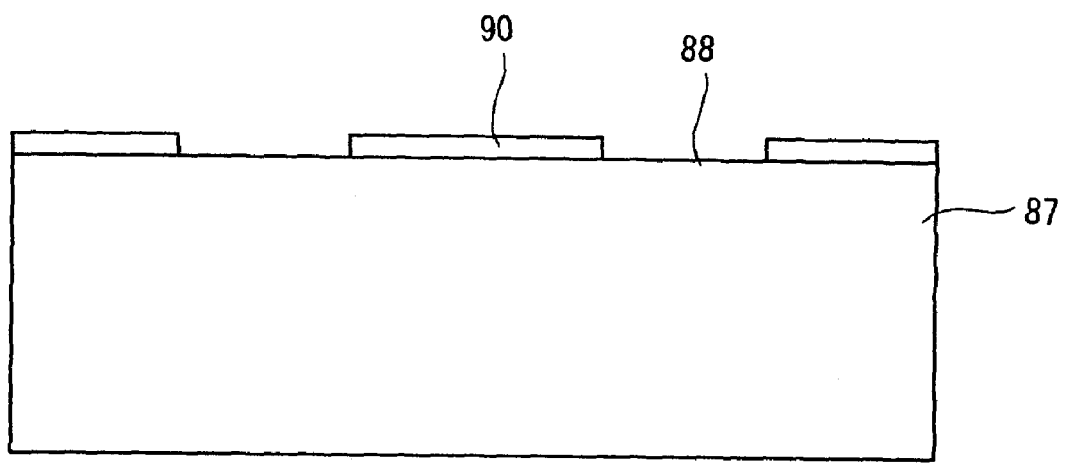
FIGS. 1A and 1B are cross-sectional diagrams of a semiconductor substrate used to examine an etching selectivity of a mask material.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the present invention, a blocking film is used so that a dry etching using chlorine gas from backside does not reach to lines on the surface. For the blocking film, metals of group 8 element are appropriate. This concerns the principle of the present invention, which is described hereinafter.

Semiconductor substrate materials such as Si, GaAs, InP, GaN and SiC can be dry etched using chlorine (Cl) or bromine (Br) gas. For this dry etching, there is an etching called reactive ion etching or parallel plate type that applies a high-frequency power between 2 parallel electrodes. In the apparatus, cation is concentrated to a cathode side for example and a high field electric portion (ion sheath) is generated. By disposing a wafer over the cathode, a dry etching is performed by sputtering and reactive plasma.

Recently, a high-density plasma type dry etching apparatus with reduced sputtering ability and increased reactivity has been developed that enables a high-speed etching. The high-density plasma type device is broadly divided into ECR type that uses electron cyclotron resonance microwave and ICP (Inductively Coupled Plasma) which is an inductively coupled discharge system. However as the ECR type requires ultrahigh frequency power of several GHz, the ICP type that uses several dozen MHz of high frequency power is the mainstream.

On the other hand, group 8 element in the periodic table of elements is metal. Group 8 element is stable and slow to react under the temperature of several hundreds degrees Celsius. Therefore, these metals are attracting attentions as use for electrodes or the like of special parts. As for group 8 element, there are following 9 kinds; atomic number 26 iron (Fe), 27 cobalt (Co), 28 nickel (Ni), 44 ruthenium (Ru), 45 rhodium (Rh), 46 palladium (Pd), 76 osmium (Os), 77 iridium (Ir) and 78 platinum (Pt). Fe, Co and Ni are used for magnetic devices and Ni, Ru and subsequent elements are used for electrode material such as semiconductor apparatus and capacitor. However these metals of group 8 element are hard to be etched by chlorine and bromine gas which are usually used for a dry etching to metal. Group 8 element has 8 valence electrons, and strong covalent bond. Hence, group 8 element is stable and hard to exhibit ionicity. Thus it can be considered that it is hard to be etched for Cl and Br in group 7B. In the meantime, metals of group 8 element can be used as a mask material. However as it is difficult to remove this mask material, it has been rarely used except for a simple experiment.

The method to perform a dry etching to the metal of group 8 element is basically a physical sputtering. As a typical method, there is an ion milling method for performing an electric field acceleration to Ar ion. Sputtering effect is created by disposing a wafer to the cathode side by a parallel plate type RIE. In this process by sputtering, an impact of scattering ion is given to the semiconductor device even through an insulating film interposed therebetween, thus there is a disadvantage that the semiconductor device is damaged.

In recent years, a reactive dry etching apparatus for processing the metals of group 8 element with low damage has been developed. This reactive dry etching apparatus is a high-density plasma type that increases chemical reactivity by heating the temperature of the substrate to 200 to 300 degrees Celsius. Conversely, by cooling the temperature of the substrate close to 0 degree Celsius by water cooling or the like, the metals are hard to be etched.

Iron (Fe) or the like of group 8 element bonds with oxygen to generate reactant of $Fe_2O_3$ or $Fe_4O_3$ and exhibit properties of bivalence or trivalent cation. Therefore, when adding component of oxygen (O) or sulfur (S) which are group 6B in the periodic table of elements to etching gas, a reactant of these components and group 8 element is generated. Then by replacing O and S with Cl and Br, a reactant of Cl (or Br), group 8 element component and group 7B element component. This enables a dry etching to the metals of group 8 element. However, as these etchings require intermediate processes, the etching rate is slow.

Figure 1B:
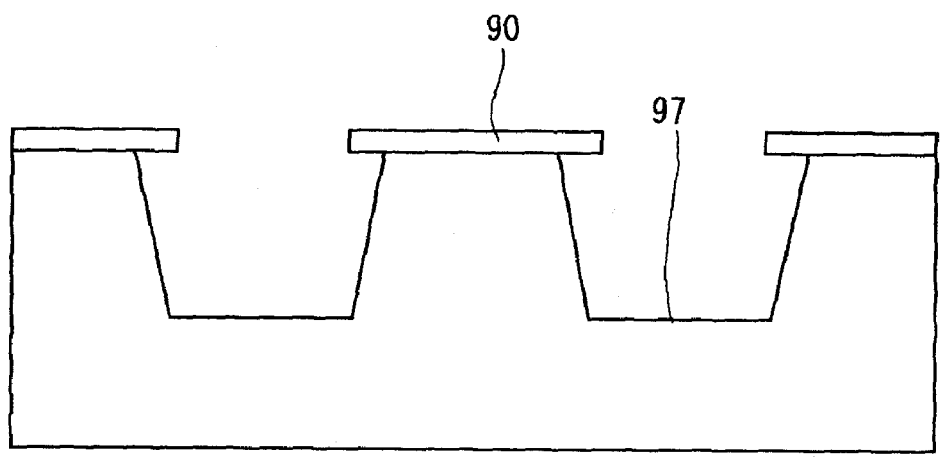

Hereinafter, 9 kinds of group 8 element film used in the present invention and etching selectivity of a semiconductor substrate are described in detail. FIGS. 1A and 1B are cross-sectional diagrams of a semiconductor substrate formed to examine an etching selectivity of a mask material. The cross-sectional diagram shown in FIG. 1A is a semiconductor substrate before etching. As shown in FIG. 1A, to the surface of a semiconductor substrate (wafer) 87, a metal film 90 of group 8 element is deposited by sputtering to have a thickness of 100nm (0.1 μm). To the metal film 90, an opening 88 is provided having a several mm width to accept a needlepoint of a needle for measuring a step. The opening 88 is formed in the following way. After providing a photoresist film having an opening, the metal film 90 of group 8 element is removed by etching using Ar ion milling or RIE sputtering to expose the semiconductor surface and the photoresist is removed. In this way, a prepared semiconductor substrate 87 is thrown into a dry etching apparatus. The dry etching apparatus etches the semiconductor substrate 87. Then the semiconductor substrate having a trench 97 shown in FIG. 1B is formed. The semiconductor substrate is taken out from the dry etching apparatus. The depth of the trench 97 of the opening 88 is measured by an asperity measurement apparatus. One of the asperity measurement apparatus scans a measuring object horizontally with a fine probe, and the other one uses light interference.

As for the metals of group 8 element to be used as the mask film 90, there are following 9 kinds; atomic number 26 iron (Fe), 27 cobalt (Co), 28 nickel (Ni), 44 ruthenium (Ru), 45 rhodium (Rh), 46 palladium (Pd), 76 osmium (Os), 77 iridium (Ir) and 78 platinum (Pt). Fe, Co and Ni are used for magnetic devices and Ni, Ru and subsequent elements are used for electrode material such as semiconductor device. Therefore, as a target for sputtering, a high-purity element of 99.99% or more can be obtained.

An etching selectivity under a first etching condition is described hereinafter. The first etching selectivity uses a high-purity semi-insulating GaAs substrate as the semiconductor substrate 87. For the dry etching apparatus, ICP is used. Conditions for a dry etching is that RF antenna power is 500 W (13.56 MHz), RF bias power is 30 W (2 MHz), etching gas $Cl_2/SiCl_4$ is $8.45 \times 10^{-2}/8.45 \times 10^{-2}$ Nm/s (50/50 sccm) etching pressure is 2 $N/m^2$, substrate cooling temperature is 0 degree Celsius and backside He pressure of substrate cooling is 600 $N/M^2$. Note that the dry etching condition is used in the embodiment of the present invention described later.

Under the first etching condition, an etching is isotropic only with $Cl_2$. By adding $SiCl_4$ and generating a deposit to the lateral surface, a vertical processing shape is formed. In order to cool the wafer substrate 87, helium (He) is passed between a substrate mount and wafer to accelerate heat conduction of the cooling. Leaked He flows inside etching chamber and joins the etching gas. The etching rate of the GaAs substrate 87 under this condition is approx. 4 μm/min.

The mask film 90 of 9 kinds of group 8 element is dry etched so that thickness of the mask is 0.1 μm. The GaAs substrate is trenched for approx. 100 μm. For Fe and Co, mask metal has disappeared. For Fe, approx. 30 μm and for Co, approx. 70 μm of steps remained. It is considered that after the mask film 90 has disappeared, the overall semiconductor substrate 87 is etched back with those steps remained. Therefore, an etching selectivity of Fe is about 300 times and a selectivity of Co is approx. 700 times. Except Fe and Co, a selectivity is 1000 times or more.

An alloy of Fe and Co 1:1 and Fe and Ni 1:1 are used as targets. The alloy targets are etched until the depth of a trench is approx. 100 μm using a mask film deposited to have a 0.1 μm thickness by sputtering. For the alloy of Fe and Co, the mask film 90 has disappeared and a trench of approx. 60 μm remained. Accordingly, an etching selectivity of the alloy of Fe and Co is approx. 600 times. As for the alloy of Fe and Ni, the mask film 90 remained, thus an etching selectivity is 1000 times or more. As a result, it is presumed that an etching selectivity is high for an alloy combining metals of group 8 element each having a high etching selectivity.

On the other hand, for group 4A titanium (Ti), group 5A vanadium (V), niobium (Nb), tantalum (Ta), group 6A chromium (Cr), molybdenum (Mo) or tungsten (W), an etching selectivity under this ICP condition is several to several dozen times, which is small.

For dry etching gas, $BCl_3$ or a combination of $BCl_3$ and $Cl_2$ etc. can be used. Basically, chlorine (Cl) contributes to the etching of a semiconductor substrate. There is no difference that a metal film of group 8 element is hard to be etched.

An etching selectivity under a second etching condition is described hereinafter. In the second etching condition, Si is used for the semiconductor substrate 87 and ICP is used for the dry etching apparatus. Conditions for a dry etching is that antenna power is 600 W (13.56 MHz), RF bias power is 60 W (2 MHz), etching gas $Cl_2$/HBr is $8.45 \times 10^{-2}/8.45 \times 10^{-2}$ Nm/s (50/50 sccm), etching pressure is 2 Pa, substrate cooling temperature 30 degrees Celsius and backside He pressure of substrate cooling is 600N/m². This dry etching condition is also incorporated in the embodiment of the present invention described later.

The etching rate of the Si substrate under this condition is approx. 3 μm/min. HBr, a component of etching gas, concerns generations of lateral deposit $SiBr_x$ and vertical workability. $Cl_2$ has an isotropic workability and an etching with $Cl_2$ is fast. Furthermore, it is assumed that a substrate via-hole unit has larger space in horizontal direction as compared to a trench of each device. Conditions are set with particular emphasis on excavating faster and deeper rather than shaping the via-hole to be vertical. With the vertical angle of 90 degrees, the processed shape is that slope of 70 to 80 degrees or barrel shape with middle part inflated.

When the thickness of a mask film 90 formed of 9 kinds of group 8 elements is 0.1 μm, a Si substrate is trenched so that the depth of a trench is appox. 100nm. For Fe, Co and Ni, the mask metal has disappeared and for Fe, approx. 20 μm, for Co, approx. 50 μm and for Ni, approx. 80 μm of steps remained. It is considered that after the mask film 90 has disappeared, the overall semiconductor substrate 87 is etched back with those steps remained. Therefore, an etching selectivity of Fe, Co and Ni is respectively about 200 times, 500 times and 800 times. Except Fe, Co and Ni, a selectivity is 1000 times or more. Therefore, for any metals of group 8 element, there is a selectivity of 100 times or more.

On the other hand, for group 4A titanium (Ti), group 5A vanadium (V), niobium (Nb), tantalum (Ta), group 6A chromium (Cr), molybdenum (Mo) or tungsten (W), an etching selectivity under this ICP condition is several to several dozen times, which is small.

Note that as a dry etching to the semiconductor substrate 87, a parallel plate type RIE may be used with care over condition. When increasing the electric power of etching, ion sheath voltage also increases thus the strength of sputtering improves. Then an etching selectivity to the group 8 element film is reduced. So an etching to form the backside via-hole is started with a large electric power and the electric power is reduced before exposing the group 8 element film of the bottom of the surface via-hole. This ensures certain etching selectivity to the group 8 element film.

Hereinafter, an embodiment that the present invention can be incorporated is described. The explanation below is regarding the embodiments of the present invention and the present invention is not limited to the embodiments below.

First Embodiment

Figure 2:
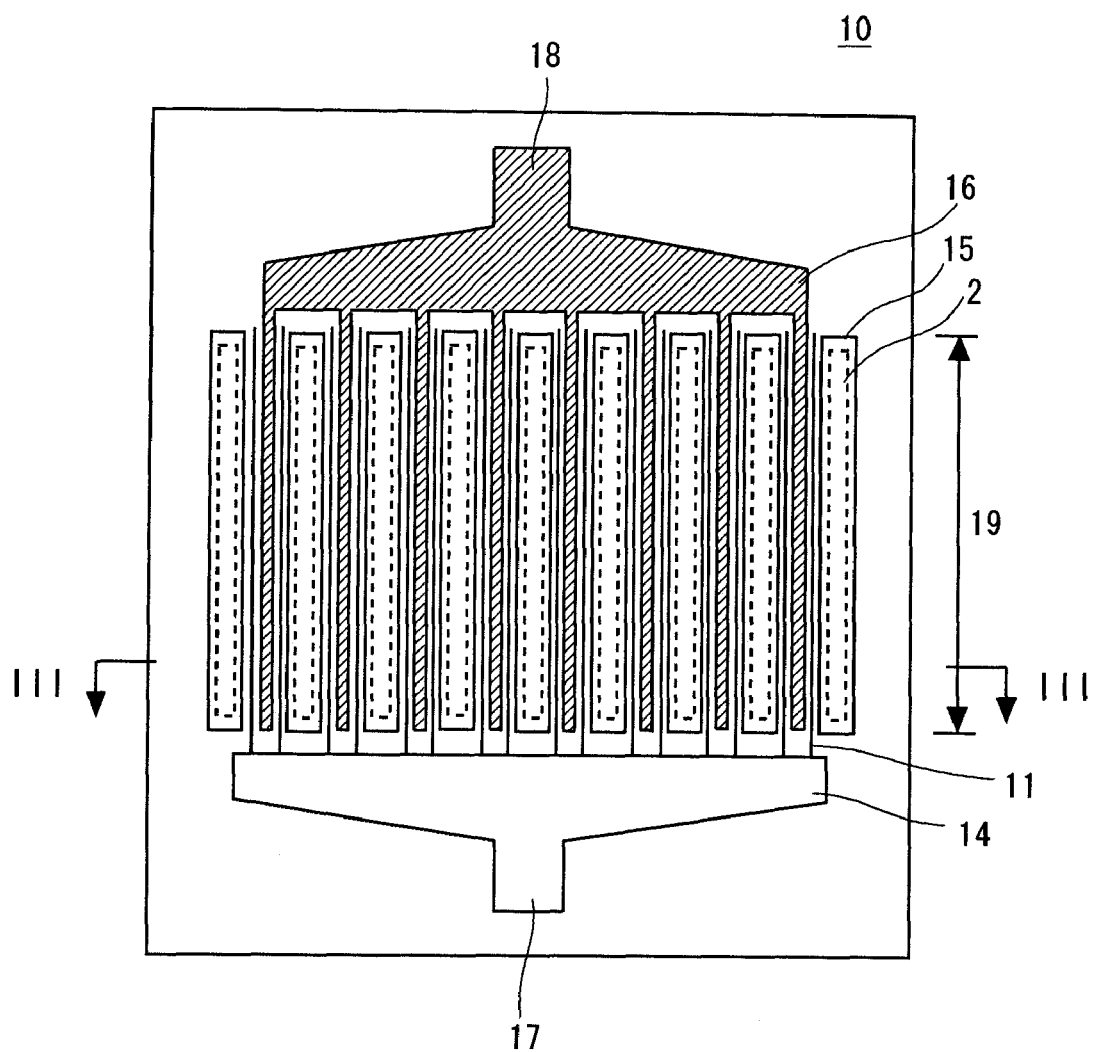
FIG. 2 is a top view of a semiconductor chip having a field-effect transistor formed thereto according to a first embodiment of the present invention.
Figure 3:
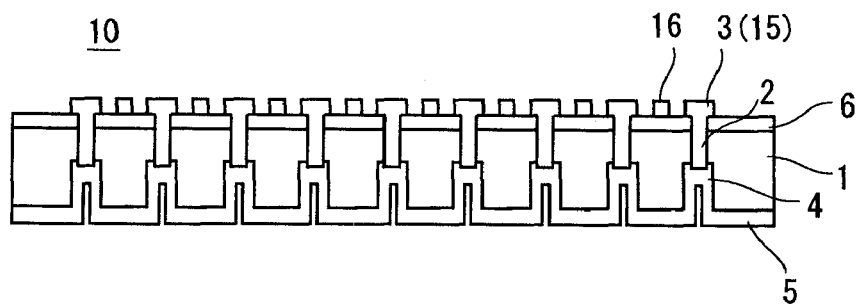
FIG. 3 is the across-sectional view of a semiconductor chip having the field-effect transistor formed thereto according to the first embodiment of the present invention.
Figure 4:
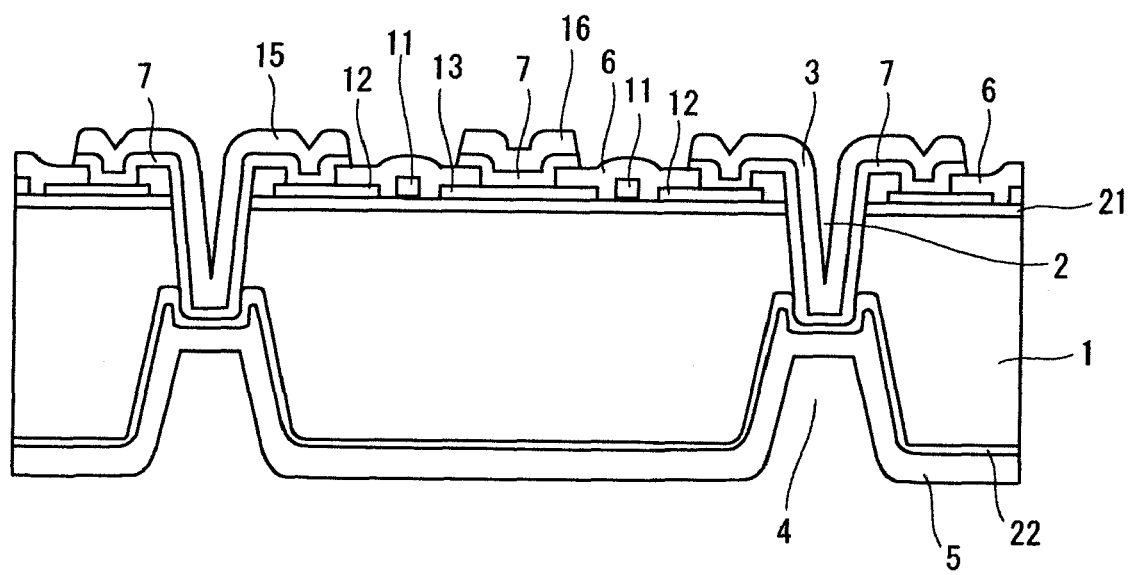
FIG. 4 is a cross-sectional diagram enlarging a part of FIG. 3.

A semiconductor apparatus of this embodiment is described hereinafter in detail with reference to the drawings. FIG. 2 is a top view showing the structure of a semiconductor chip for a field-effect transistor (FET) according to a first embodiment. FIG. 3 is a cross-sectional diagram showing the configuration of the semiconductor chip for the field-effect transistor according to the first embodiment. FIG. 3 is a cross-sectional diagram taken along the line III-III of FIG. 2. FIG. 4 is a cross-sectional diagram enlarging a part of FIG. 3. In this embodiment, a GaAs field-effect transistor (hereinafter referred to as a GaAs FET) is used for the semiconductor chip 10.

For the GaAsFET, to the surface of the semi-insulating GaAs substrate, an n type GaAs conductive layer or a channel layer by an n type AlGaAs/i type InGaAs hetero layer is formed. Furthermore, a Schottky contact gate electrode is formed on the channel layer. A source electrode is provided to one side of the gate electrode and a drain electrode is provided to another side. Moreover, in the peripheral part of the active area, a device isolation area is included having a high resistance by a mesa etching and ion implantation or the like.

The top view of FIG. 2 schematically shows the wiring pattern to be connected to these electrodes. In FIG. 2, an area width 19 having a channel layer area of the GaAsFET is illustrated. Line shaped gate electrode 11 is formed on the channel layer area. A thin strip shaped source line 15 and drain line 16 are provided to both sides of the gate electrode 11. These are placed alternately, as in source, gate, drain, gate, source, gate, drain and gate. One end of the gate electrode 11 is commonly connected to the wide strip shaped gate line 14. Furthermore, near the center of the gate line 14, a gate pad 17 is provided for wire bonding connection. On the other hand, the thin strip shaped line of the drain line 16 is commonly connected to the wide strip shaped line on the other side of the gate pad 17 and near the center of the wide strip shaped line, a drain pad 18 is provided. To the GaAs substrate below the thin strip shaped source line 15, there is an opening of a surface via-hole 2 indicated by dotted line. The surface via-hole 2 is connected to a backside electrode provided to the entire backside of the GaAs substrate.

The semiconductor chip 10 is described hereinafter with reference to FIG. 3 illustrating the cross-section of the semiconductor chip 10 taken along the line III-III of FIG. 2. The semiconductor chip 10 has a semiconductor device formed to the surface of the GaAs substrate 1. However in FIG. 3, gate electrode and device structure are omitted and source and drain lines are illustrated schematically. As multilayer interconnection is formed on the surface of the semiconductor chip substrate 1, an insulating film 6 such as $SiO_2$ is formed. Over the insulating film 6, the drain line 16 and source line 15 are formed which can be shown in the top view of FIG. 2. Below the source line 15, the surface via-hole 2 is formed by excavating shallower than the thickness of the GaAs substrate 1 in the thickness direction of the GaAs substrate 1. As a surface via line 3, a conductor is buried in the surface via-hole 2. On the other hand, a backside via-hole 4 is formed with a depth of a trench reaching to the bottom of the surface via line 3. A backside electrode 5 is provided to the entire backside of the semiconductor chip 10. The backside electrode 5 is also buried in the backside via-hole 4. This enables the backside electrode 5 to electrically connect with the bottom of the surface via line 3. In this embodiment, the number of the surface via-holes 2 corresponds to that of backside via-holes 4. One backside via-hole 4 is in contact with one surface via-hole 2.

FIG. 4 is a cross-sectional diagram enlarging configuration near one drain line 16, focusing the drain line 16. The GaAs-FET device formed to the surface is described hereinafter in detail with reference to FIG. 4. A channel layer 21 is formed by a conductive semiconductor to the surface of the GaAs semiconductor substrate 1. This is formed by an n type GaAs layer formed by an ion implantation and n-AlGaAs/i-InGaAs hetero layer by epitaxial growth or the like. Over the channel layer 21, schottky contact gate electrode 11 of WSi or Al or the like is provided. To the both sides of the gate electrode 11, source electrode 12 and drain electrode 13 which are ohmic contact of AuGeNi alloy or the like is provided. A contact region (not shown) which is conductive semiconductor highly concentration of impurity doped is provided below the ohmic electrode in order to ensure ohmic contact. If the channel layer 21 is formed by an ion implantation, the contact region is formed as a highly concentrated n type GaAs region by a selective ion implantation. If the channel layer 21 is formed by an epitaxial growth, the contact region is formed as a highly concentrated n type GaAs layer or highly concentrated n type InGaAs region.

The surface of the GaAsFET device is covered by the insulating film 6 such as $SiO_2$ having several µm thickness. To the area of the insulating film 6 corresponding to the upper part of the source electrode 12 and drain electrode 13, an opening of a through-hole is provided. The source line 15 and drain line 16 are connected to each electrode via the through-hole. As the source line 15 and drain line 16, a Ti layer of about 50 nm thickness, Pt layer of about 200 nm (0.2 µm) thickness and Au layer of about 5 µm thickness are sequentially deposited from the side of the electrode. To protect these lines, an insulating and resin film may further be provided (not shown). The source line 15 is formed inside the surface via-hole 2 as the surface via line 3 by deposition. The Pt layer of group 8 element corresponds to the blocking film 7 in the drawings. The Ti layer bonds the electrodes and lines. The exposed part of Ti layer inside the backside via-hole 4 is removed in a dry etching process to the backside. The backside electrode 5 is provided to the entire backside of the semiconductor substrate 1. The backside electrode 5 has a laminate structure comprising a Ti layer of 100 nm thickness as an adhesive film 22 and an Au layer of 5 µm thickness. The backside electrode 5 is formed inside the backside via-hole 4 by deposition to be electrically connected with the bottom of the surface via line 3.

Size of each part in the semiconductor chip according to this embodiment is described as an example. The thickness of the semiconductor substrate 1 is approx. 150 µm, width on the surface side of the surface via-hole 2 is approx. 10 µm and depth is approx. 70 µm. The width of the backside of the backside via-hole 4 is approx. 20 µm and depth is approx. 90 µm. The bottom of the surface via line 3 projects to the backside via-hole 4 for approx. 10 µm. It is only necessary to connect electrically between the backside line 5 formed to the backside via-hole 4 and the source line 15 formed to the surface via-hole 2. It is not necessary to form the backside via-hole 4 in the area wider than the bottom of the surface via-hole 2. But part of both may only be in contact. For example, it may be that the backside line 5 and surface via line 3 are partly in contact due to a misalignment in aligning the backside exposure. It may be that the backside line 5 is partly in contact with the inner side of the bottom of the surface via line 3.

To fix a package or the like with the semiconductor chip 10, a soldering material such as AuSn is used. This is because that wetting characteristic between the Au film of the backside electrode 5 and AuSn soldering material is preferable. The AuSn soldering material is filled into the concave portion of the backside via-hole 4, so it makes enable to ensure radiation. Although Sn alloy reaction of the AuSn solder proceeds inside the Au film, in the flat portion, it stops at the surface of the Au film. The Pt layer of the blocking film 7 has a higher alloying temperature with Sn as compared to Au. Even if the alloy reaction inside the backside via-hole 4 abnormally proceeds, the alloy reaction can be stopped by the blocking film 7.

A manufacturing method of a semiconductor apparatus according to this embodiment is described hereinafter in detail with reference to FIG. 5. FIGS. 5A to 5D are cross-sectional diagrams showing each manufacturing process of the semiconductor apparatus having a double-sided substrate via-hole according to the first embodiment. FIGS. 5A to 5D show only the vicinity of the double-sided substrate via-hole for the semiconductor apparatus.

Figure 5A:
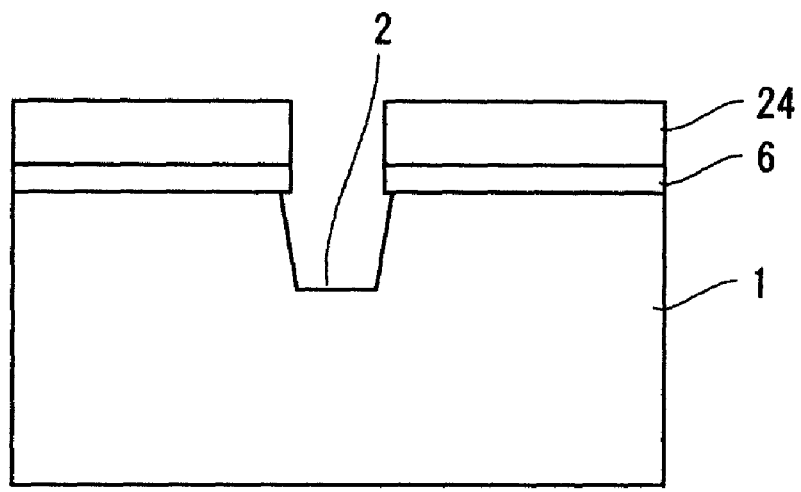
FIGS. 5A to 5D are cross-sectional diagrams illustrating a manufacturing process of a double-sided substrate via-hole unit according to the first embodiment of the present invention.

FIG. 5A is a cross-sectional diagram of the semiconductor apparatus after completing a first process. In the first process, to the surface of the GaAs substrate 1 having approx. 650 µm thickness, a semiconductor device (not shown) such as GaAs-FET is formed. A $SiO_2$ film is deposited for approx. 2 µm over the semiconductor device as the insulating film 6 for multilayer interconnection. Over the insulating film 6, a photoresist film 24 of 4 µm thickness having an opening pattern of the surface via-hole 2 is formed. By RIE or the like using $CF_4$ gas, the opening pattern is formed to the insulating film 6 by dry etching. At this time, the width of the opening pattern is 8 µm.

Using the photoresist film 24 as a mask, the exposed GaAs substrate 1 is trenched with a depth of trench approx. 70 µm by a dry etching. So, the surface via-hole 2 is formed. For the dry etching apparatus, ICP is used and a dry etching is performed under the following condition. The condition is same as the abovementioned first etching condition. Conditions for a dry etching is that RF antenna power is 500 W (13.56 MHz), RF bias power is 30 W (2 MHz), etching gas $Cl_2/SiCl_4$ is $8.45\times10^{-2}/8.45\times10^{-2}$ Nm/s (50/50 sccm), etching pressure is $2 N/m^2$, substrate cooling temperature is 0 degree Celsius and backside He pressure of substrate cooling is $600 N/m^2$.

Only with $Cl_2$, etching is isotropic. So, by adding $SiCl_4$ and generating a deposit to the lateral surface, the trench is made to have a vertical processing shape. In order to cool the wafer substrate, helium (He) is passed between a substrate mount and wafer to accelerate heat conduction of the cooling. Leaked He flows inside an etching chamber and joins the etching gas. The etching rate of the GaAs substrate under this condition is approx. 4 µm/min. A selectivity to the photoresist film is 40 times.

Etching time for a via-hole is calculated based on the etching rate. The etching rate is calculated by etching a dummy wafer having a pattern mask with wide opening before the actual process. To calculate the etching rate, the depth of the etched trench is measured and the measurement is divided by etching time. It is preferable to confirm that the etching rate is within the management range. The etching time for the actual process is set by dividing a target depth of a trench by this etching rate and multiplying by correction coefficient of pattern crude density. The correction coefficient is a ratio between the target trench depth of the opening pattern measured by a cross-sectional SEM (Scanning Electron Microscope) and a step measured by a wide pattern.

Figure 5B:
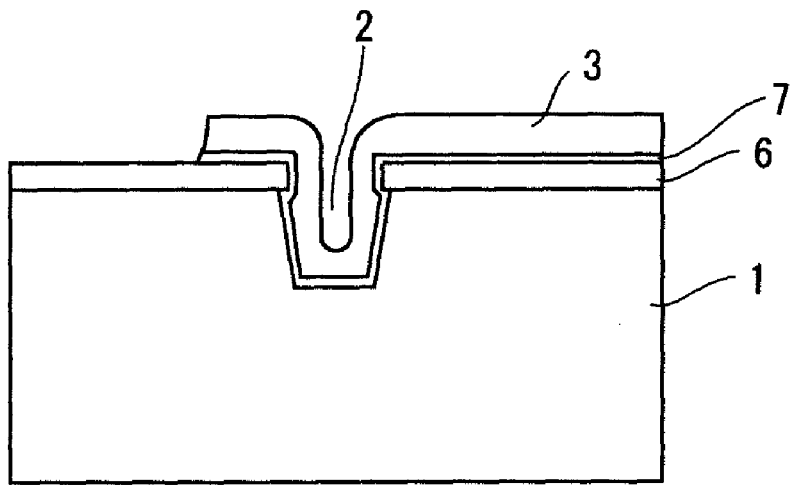

FIG. 5B is a cross-sectional diagram of the semiconductor apparatus after completing a second process. In the second process, the photoresist film 24 formed over the insulating film 6 and used as a mask is peeled and removed. By a dilute aqueous solution of sulfuric acid and hydrogen peroxide solution, inside of the trenchd surface via-hole 2 is etched and cleansed. Next, in the sputtering deposition apparatus, a Ti layer of about 50nm thickness, Pt layer of about 200nm thickness (acting as the blocking film 7) and Au layer of about 200nm thickness are sequentially deposited from the side of the insulating film 6. At this time, each layer is deposited to the entire surface of the semiconductor chip. A photoresist film is formed as a mask to the portion excluding the area used as a wiring layer and Au plating is formed for approx. 5 μm with a sputtered Au layer as a feeding layer. Next, the photoresist film is removed. After that, a photoresist film is again provided to cover the Au plated area. Each layers of Au/Pt/Ti deposited by sputtering using Ar ion milling is removed by etching to expose the insulating film 6. To the area used for a wiring layer, a wiring layer depositing each layer of Au/Pt/Ti is formed. If there is the insulating film 6 such as SiO2having 0.5 μm or more thickness over the semiconductor device, the damage of the ion milling does not influence the semiconductor device.

Figure 5C:
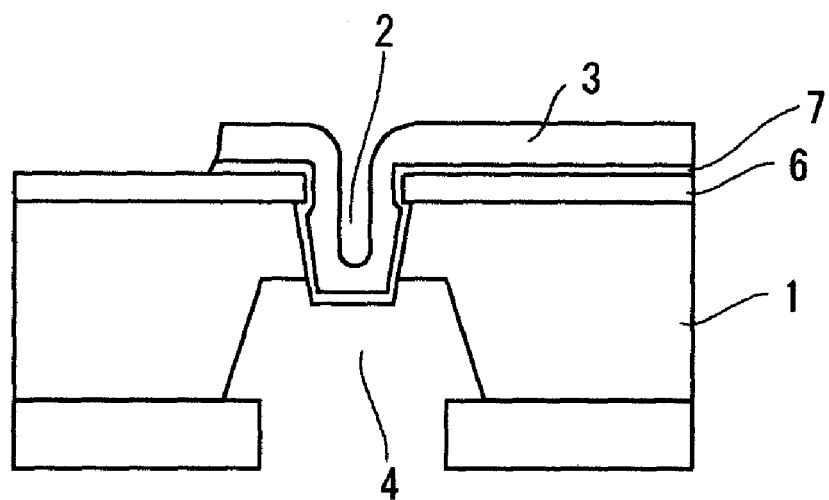

FIG. 5C is a cross-sectional diagram of the semiconductor apparatus after completing a third process. In the third process, the surface of the GaAs substrate 1 is fixed to a slightly larger transparent glass substrate (not shown) by wax or resin. The backside of the GaAs substrate 1 is polished so that the thickness of the substrate is reduced from approx. 650 μm to 150 μm. For this wax or resin, it is preferable to select the one not dissolved in a solvent of the photoresist in a photoresist process of the GaAs substrate 1, which is performed later. While the GaAs substrate 1 is fixed to the transparent glass substrate, a photoresist film 25 having 6 μm thickness is formed to the backside of the GaAs substrate 1. The photoresist film 25 is formed in the area excluding the opening pattern of the backside via-hole 4. Aligning the pattern of the photoresist film 25 formed to the backside is performed by reading a position mark on the surface through the transparent glass substrate or reading a metal position mark from the backside through the semiconductor substrate using a infrared light. The aligning accuracy of such backside exposure is several μm, which is worse as compared to the aligning accuracy of a normal stepper photolithography apparatus of about 0.1 m. As the photoresist film 25 is thick, the opening pattern to be formed tends to be wider than a pattern formed to the glass mask. Corners of the opening pattern are rounded.

With the photoresist film 25 as a mask, the backside of the GaAs substrate 1 is trenched with the depth of the trench approx. 90 μm by a dry etching. In this way, the backside via-hole 4 is formed to expose Pt of the blocking film 7 which is the bottom of the surface via line 3. For the dry etching apparatus, ICP is used and a dry etching is performed under the same condition as the surface. The substrate cooling is performed through a glass substrate fixing the wafer. Hence the increase temperature of the wafer is higher than the surface side at etching. Therefore, the cross-sectional shape of the opening pattern unit to be formed is isotropic or barrel shape. The etching tends to be faster according to the cooling state and in periphery of the wafer. It is preferable to assume 10±5 μm as an accuracy to expose the bottom of the surface via line 3.

Figure 5D:
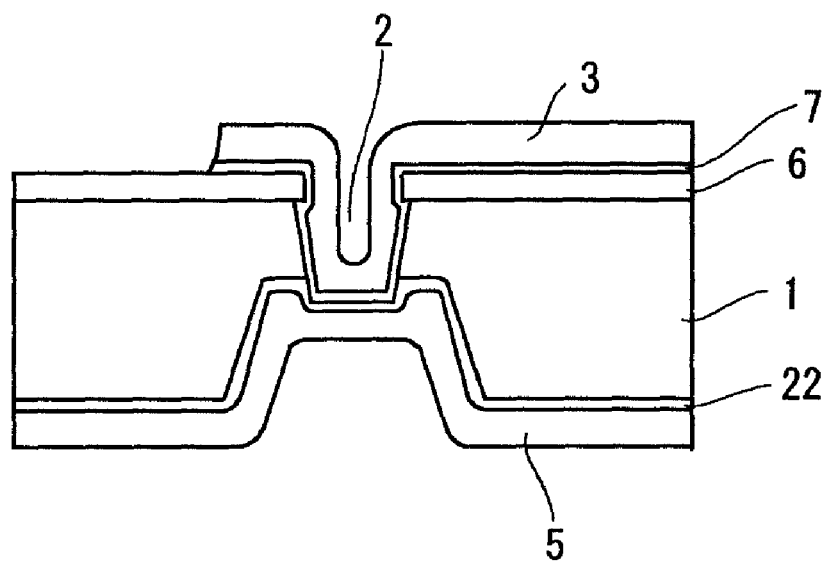

FIG. 5D is a cross-sectional diagram of the semiconductor apparatus after completing a fourth process. In the fourth process, while the GaAs substrate 1 is fixed to the glass substrate, the photoresist film 25 is peeled and removed. With the GaAs substrate 1 fixed to the glass substrate, a sputtering deposition is performed to the backside of the GaAs substrate to form a Ti layer of approx. 100 nm thickness as the adhesive film 22. Next, an Au layer of 200 nm thickness is deposited. Glass substrate surface in the periphery of the GaAs substrate 1 is preferably covered by a thin metal or plastic as a mask. A thin Au layer is plated as a feeding layer for 5 μm thickness to provide the backside electrode 5. The backside is adhered to the adhesive sheet, wax or the like on the surface side is melted to peel the glass substrate. By performing a dicing or the like to the GaAs substrate 1 while the surface side of the semiconductor substrate 1 is fixed to the adhesive sheet, the GaAs substrate 1 is separated to be chips. Individual semiconductor chips are taken from the adhesive sheet to assemble a package.

As described above, the blocking film 7 of metal group 8 element is provided to the interface inside the surface via-hole 2. When dry etching from the backside of the backside via-hole 4 uses chlorine gas, with using a material of group 8 element as the blocking film 7, an etching selectivity to the GaAs substrate 1 can be 100 times or more. The blocking film 7 is able to prevent the conductor formed in the surface via-hole from being etched by an etching from the backside. When providing the backside electrode 5 inside the backside via-hole 4, an electric conductivity with low resistance is secured as the blocking film 7 is metal. When the line including the blocking film 7 on the surface side is processed by the dry etching, it needs a sputtering such as ion milling to be used. With an insulating film with 0.5 μm or more thickness at this time, the semiconductor is not damaged. As the surface via-hole 2 is not trenched deeply, accuracy can be ensured. So, the surface via-hole 2 is formed with thin shape. On the other hand, as semiconductor device and wiring pattern is not formed to the backside, it can be processed with relaxed processing accuracy.

In the above explanation, the semiconductor substrate 1 is explained with a GaAs substrate as an example, however the semiconductor substrate is not limited to the GaAs substrate. The semiconductor substrate 1 can be dry etched by other chlorine or bromine gas. The semiconductor substrate 1 may be Si, InP, GaN and SiC.

The blocking film 7 is explained with Pt as an example, however it is not limited to this. As described above, it may be an alloy combining metals of group 8 element except Pt or group 8 element.

As stated above, the blocking film 7 of the group 8 element has explained to have an etching selectivity of 100 times or more for the semiconductor substrate 1. However this is in the flat state. As the blocking film is deposited inside the trench by sputtering or the like, the film is thin inside the trench. It is considered that deterioration of the film quality such as the film thickness is reduced in the corner of the bottom. Corner of the bottom is easier to be etched. Therefore, it is preferable that the thickness of the flat part of the blocking film 7 is several to several dozen times than the limit of the thickness tolerable to over-etching of the semiconductor substrate 1. In this embodiment, the thickness of the Pt film is 200nm. This is much thicker than the limit thickness of the blocking film 7.

Second Embodiment

Figure 6:
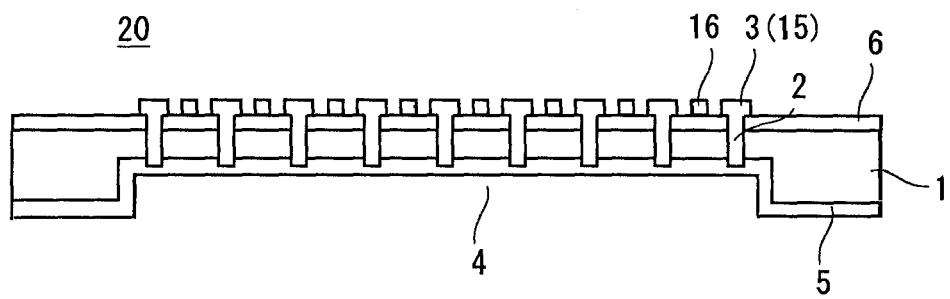
FIG. 6 is a cross-sectional diagram of a semiconductor chip having a field-effect transistor formed thereto according to a second embodiment of the present invention.
Figure 7:
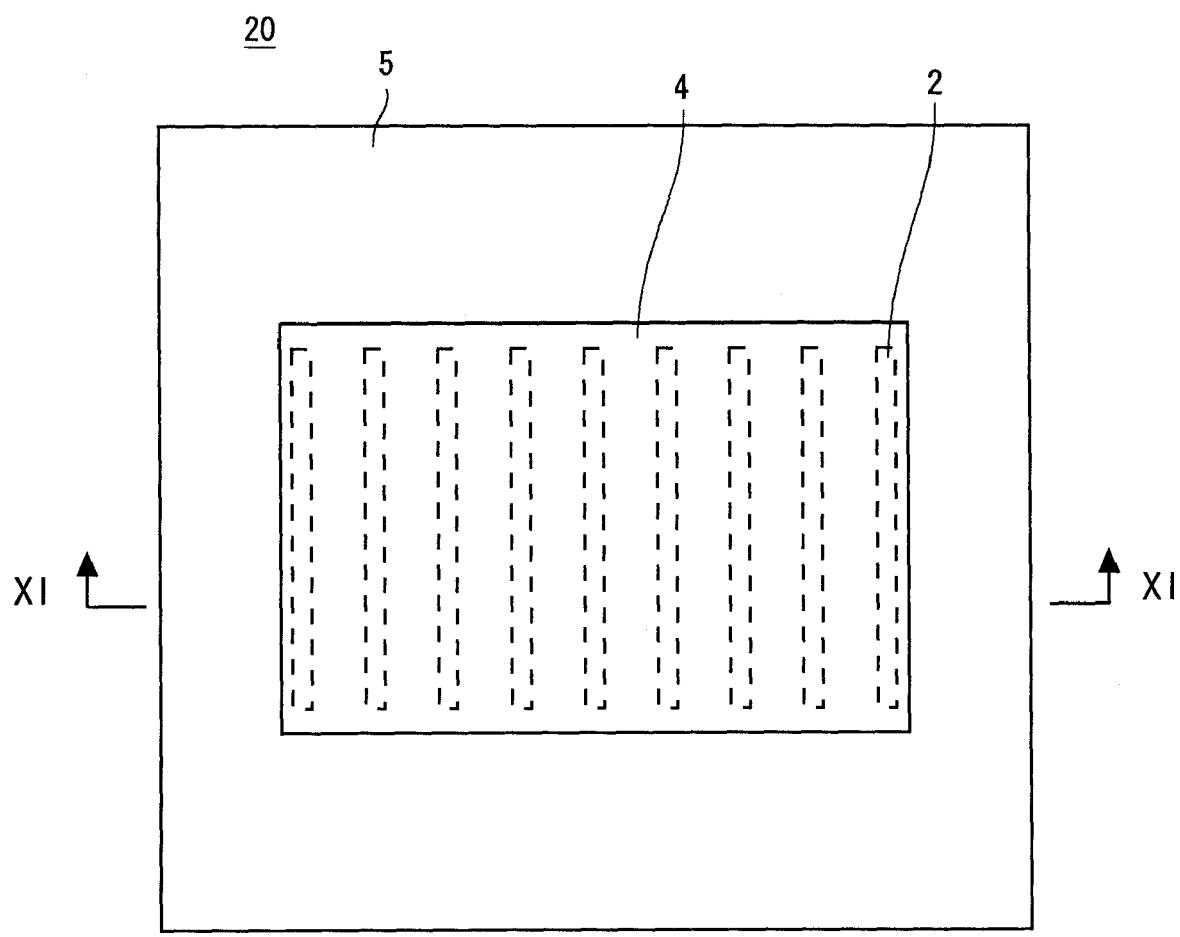
FIG. 7 is a cross-sectional diagram of the semiconductor chip having the field-effect transistor formed thereto according to the second embodiment of the present invention.

This embodiment is a modification of the backside via-hole formed by etching from the backside of the semiconductor chip 10 according to the first embodiment. FIG. 6 is a cross-sectional diagram of a semiconductor chip 20 having a field-effect transistor according to a second embodiment. FIG. 7 is a plan view (backside view) viewed from the backside of the semiconductor chip 20 having the field-effect transistor according to the second embodiment. FIG. 6 is a cross-sectional diagram taken along the line XI-XI of FIG. 7.

As shown in FIGS. 6 and 7, the backside via-hole 4 in this embodiment is formed with one trench. A plurality of surface via-holes 2 (or surface via lines 3) are connected to the backside via-hole 4 formed in this way. That is, one backside via-hole 4 is formed to the plurality of surface via-holes 2 and they are connected to each other. As the substrate below the GaAsFET device becomes thinner, the radiation performance of the GaAsFET device improves.

This embodiment is almost same as the first embodiment except the configuration of the backside via-hole 4. For example, the thickness of the semiconductor substrate 1 is approx. 150 μm, width on the surface side of the surface via-hole 2 is approx. 10 μm and depth is approx. 70 μm. The backside via-hole 4 is provided to have a depth of approx. 90 μm.

To assemble the semiconductor chip 20 into a package, a soldering material having preferable wetting characteristic such as AuSn is preferably used. AuSn solder is formed inside the trenched backside via-hole 4 and fixed to conform to the Au surface of the backside electrode 5. As the substrate below the GaAsFET device becomes thinner, the radiation performance of the GaAsFET device improves.

In the meantime, strength of the semiconductor chip 20 is ensured by the thick portion in the peripheral substrate. As shown in FIG. 7, to the surface of the thick substrate portion formed in the periphery of the semiconductor chip 20, there is no GaAsFET device or pad formed. However, in order to ensure the strength of the semiconductor chip 20, the width preferably has a certain size. This prevents the semiconductor chip 20 to crack in operations to handle the semiconductor chip 20 when applying a pressure to the semiconductor chip 20 such as dicing and package assembling. The area of the semiconductor chip 20 is preferably larger than the semiconductor chip 10 of the first embodiment.

Third Embodiment

Figure 8:
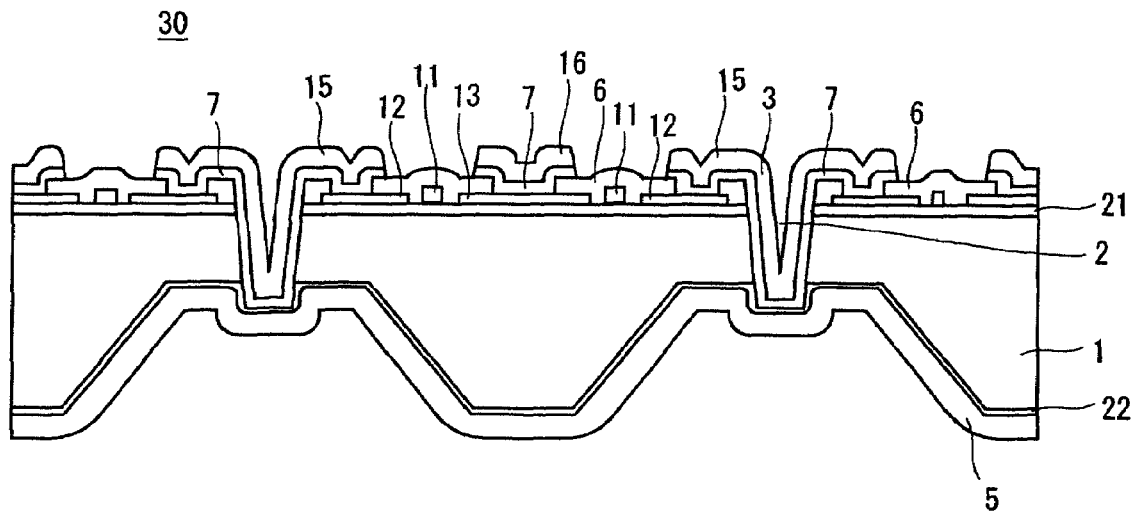
FIG. 8 is a cross-sectional diagram of a semiconductor chip having a field-effect transistor formed thereto according to a third embodiment of the present invention.

This embodiment is a modification of a illustrative embodiment of the backside via-hole 4 for the semiconductor chip 10 according to the first embodiment. FIG. 8 is a cross-sectional diagram of a semiconductor chip 30 having a field-effect transistor according to a third embodiment. As shown in FIG. 8, the shape of a backside via-hole 4 according to this embodiment is formed to be trapezoid by an isotropic etching.

In the etching of this embodiment, $SiCl_4$ is not added and only $Cl_2$ of $1.69 \times 10^{-1}$ Nm/s (100 sccm) is passed. Etching conditions except this condition are same as the first embodiment for ICP. Deposition effect to the lateral surface of $SiCl_4$ disappears and a side etching is generated to perform an isotropic etching. The backside via-hole formed in this way is trapezoid shape. Only with $Cl_2$ gas, an etching selectivity between the GaAs substrate and Pt layer is 100 times or more.

In the second embodiment, the substrate thickness below the GaAsFET device is set to be thin evenly. In this embodiment, the substrate in the bottom area of the drain electrode 13 is thick as compared to the above case. A capacitance value of the parasitic capacitance formed between the drain electrode 13 and ground electrode is reduced. Mechanical strength of the semiconductor chip 30 also increases. On the other hand, as the bottom area of the gate electrode 11 has sloped surface and a moderate thickness of the substrate is ensured, radiation effect in this area can be obtained.

As a modification of this embodiment, the backside photoresist film may be formed between the gate electrode 11 and drain electrode 13 with high accuracy alignment of the backside via-hole 4. The shape of the sidewall of the backside via-hole 4 may be step-like shape, not slope shape. In this case, by repeating a photoresist and dry etching processes, the step-like sidewall of the backside via-hole 4 can be formed.

Fourth Embodiment

Cheaper semiconductor devices are desired for general-purpose products such as cellular phone. Expensive Au and Pt cannot be used and cheap Cu or the like is used. However, wire and soldering materials not including Au has a problem that wetting characteristic is getting worse. When using Cu for wiring, as with the above embodiment using Au lines, it is difficult to definitely fill the soldering material and silver paste or the like in a thin concave portion. Thus the backside via-hole must be buried with a wiring material. As Cu is easy to be thermal diffused and generates a deep energy level in semiconductor, a countermeasure to stop the thermal diffusion is required.

Figure 9:
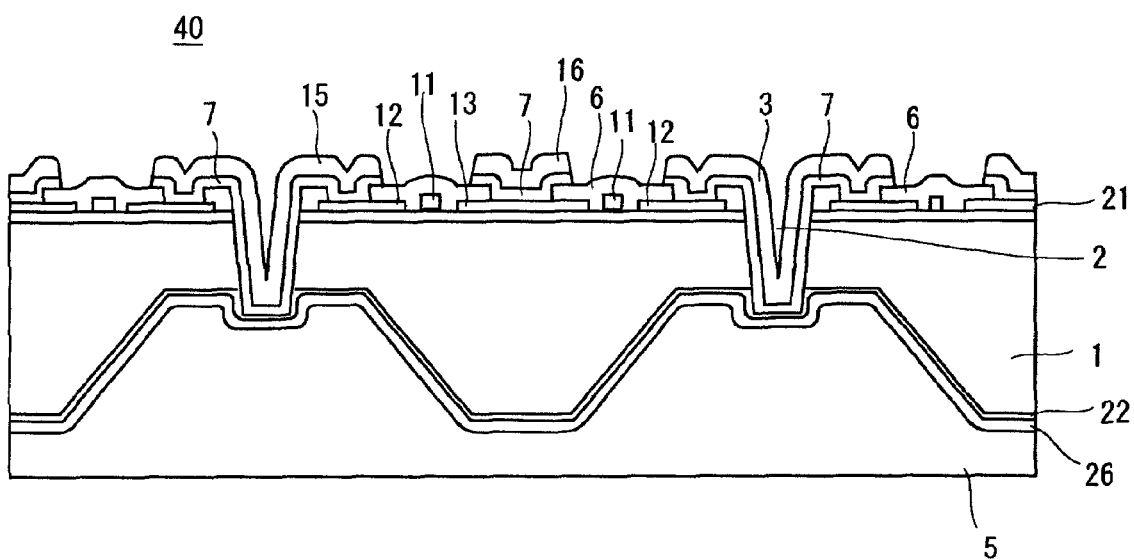
FIG. 9 is a cross-sectional diagram of a semiconductor chip having a field-effect transistor formed thereto according to a fourth embodiment of the present invention.

This embodiment is different from the semiconductor chip 30 of the third embodiment in that the wiring material is changed to Cu or the like. FIG. 9 is a cross-sectional diagram of a semiconductor chip 40 having a field-effect transistor formed thereto according to a fourth embodiment. A backside electrode formed to the backside of the semiconductor chip 40 according to the fourth embodiment has a flat surface.

The GaAsFET device formed to the surface of the GaAs substrate 1 is covered by the insulating film 6 such as $SiO_2$. To the insulating film 6 above the source electrode 12 and drain electrode 13, an opening of a through-hole is provided. The source line 15 and drain line 16 are connected via the through-hole. As the source line 15 and drain line 16, a Ti layer with about 50 nm thickness and Ni layer of about 300 nm (0.3 μm) and Cu layer by plating etc. with about 5 μm thickness are provided in this order. Same as the case of Au, Cu plated line is formed by sputter deposition of thin Cu film. The Cu film is as a feeding layer. And performing a plating process using a photoresist film deposited to the portion except wiring pattern as a mask. The feeding layer formed except the area of unformed Cu plating is removed by ion milling or the like. To protect these lines, an insulating film or resin film (not shown) may be provided.

The source line 15 is formed inside the surface via-hole 2 as the surface via line 3 by deposition. The Ni layer of group 8 element acts as the blocking film 7. The Ti layer is for adhesive and the exposed portion inside the backside via-hole 4 is removed in a dry etching process to the backside via-hole 4. To the entire surface including the backside via-hole 4 of the backside of the GaAs substrate 1, a Ti layer of approx. 100 nm thickness is formed as the adhesive film 22. Over the adhesive layer 22, an Ni layer of 300 nm thickness is formed as a barrier film 26. Over the barrier film 26, a flat Cu layer of about 30 μm thickness is formed as the backside electrode 5.

The thickness of the GaAs substrate 1 is approx. 150 μm. The depth of the surface via-hole 2 is approx. 70 μm. The depth of the backside via-hole 4 is approx. 90 μm. When forming a Cu plating with the thickness of approx. 130 μm to the backside, the backside via-hole 4 is completely buried with Cu. After that, the backside is polished so that the thickness of the Cu layer in planar portion is approx. 30 μm. The Cu layer is cut in the vicinity of the backside via-hole and becomes flat. The Cu layer is largely cut but there is not much influence to the cost of the semiconductor apparatus as the material is cheap.

The barrier film 26 to stop thermal diffusion of Cu must stop the diffusion of Cu itself in the film. As a characteristic of the barrier film 26, it is only necessary to confirm that the diffusion of Cu has stopped in the film by a high-temperature storage test according to the specification of the semiconductor apparatus. So, changing the thickness of the barrier film 26, the diffusion of Cu is prevented. For the barrier film 26, generally a high-melting point metal is used. Barrier properties of thermal diffusion improve by nitriding and siliciding. However, by nitriding or siliciding the material to be used for the barrier film 26, the resistivity of the barrier film 26 increases. However as an electrical connection must be ensured between the line formed to the surface via-hole 2 and backside electrode through the barrier film 26 interposed therebetween, conditions are limited to nitride and silicide the barrier film 26. Commonly used metals are Ti, Ta and W. TiN, TaN, TiSi, TaSi and WSi are used as well. Each metal of group 8 element has high-melting point. Therefore, there is no strong reaction to Cu at about 500 degrees Celsius and an ability to stop the thermal diffusion of Cu is included. Among group 8 element, Ni is easier to refinement as it is easy to refine and cheap to manufacture.

The wiring material of the surface and backside is not limited to Au and Cu. It only needs that the wiring material has conductive. Generally it may be Al, Al alloy or W used for plug.

Resin paste or the like including conductive particles such as silver and conductive carbon can be used for the backside electrode 5. Solder paste including solder powder and flux vehicle may be used. When disposing the semiconductor chip 40 over the melted solder or silver paste, air remains in the concave portion of the backside via-hole 4 to create a cavity. On the other hand, by coating the paste with the backside upside, solder or silver paste can be put in the concave portion formed to the backside. However in the backside process at wafer state, the wafer itself is temporarily fixed by wax or resin. So, the solder and silver paste or the like can only be temporarily hardened by a pre-bake to vaporize solvent by up to about 100 degrees Celsius. Therefore, heating in actual hardening (post baking) must be performed when mounting to a package. The solder powder of the solder paste is selected from tin (Sn), silver (Ag), copper (Cu), indium (In), bismuth (Bi), zinc (Zn) and antimony (Sb) or the like. The solder to fix the semiconductor chip 40 is preferably the one softened by a high temperature of 400 degrees Celsius or more so as not to be softened by a solder having 200 to 299 degrees Celsius that is used to a lead frame. The metal film of the backside electrode 5 contacting the solder may be copper (Cu) or Nickel (Ni).

A GaAs substrate is used as the semiconductor substrate 1, it may be Si, SiC, GaN and InP for example. For all the dry etchings, Cl or Br gas is used and treated in the same way.

Fifth Embodiment

The semiconductor chips according to the first to fourth embodiments have a configuration of repeating electrodes alternately, as in source, gate, drain, gate and source. To the lower part of the source electrode 12, a thin and long strip shaped substrate via-hole is formed. The substrate via-hole is not limited to the one formed with such shape. As for this embodiment, a substrate via-hole having a different shape from the above embodiments is described.

Figure 10:
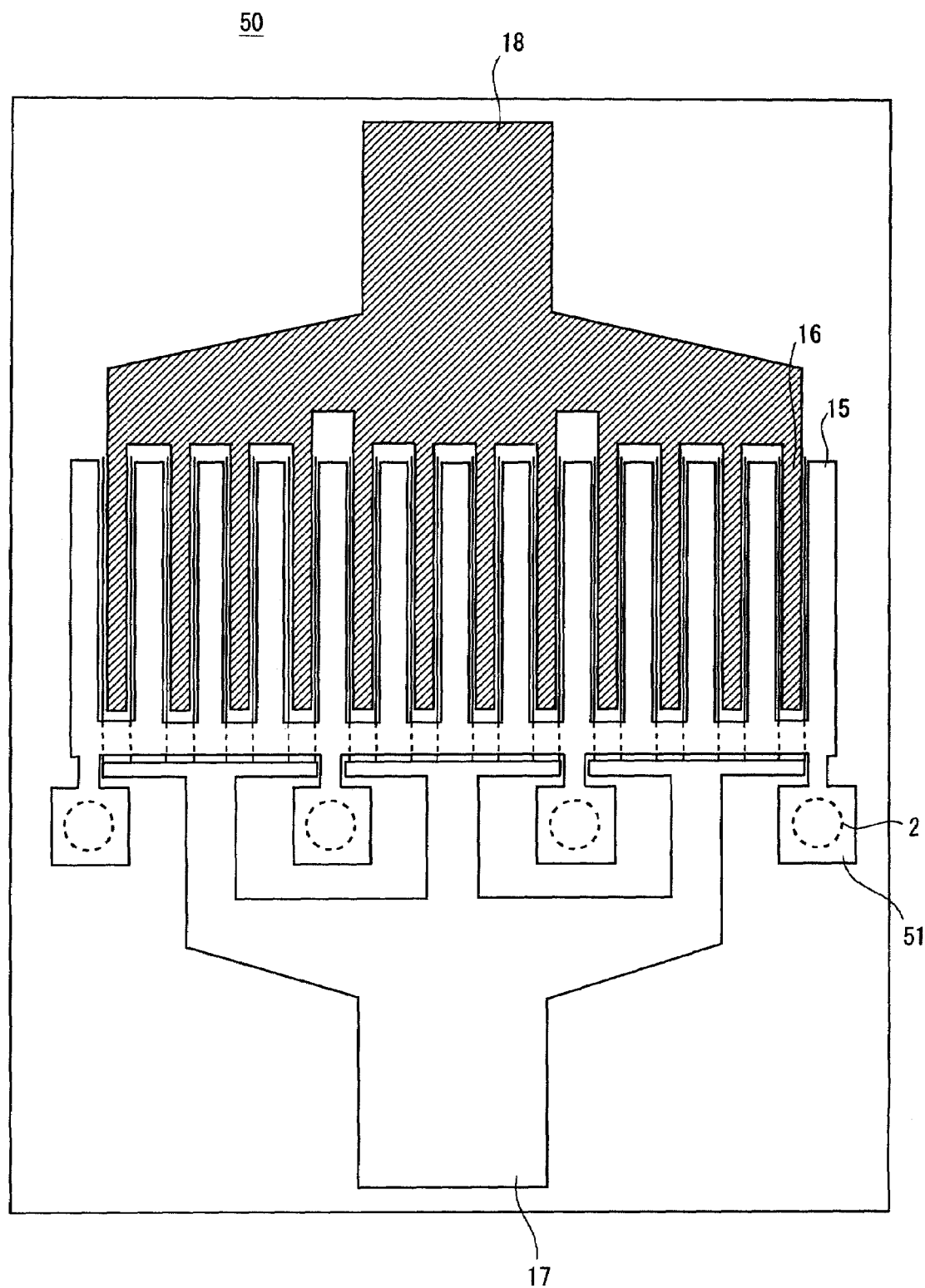
FIG. 10 is a top view of a semiconductor chip having a field-effect transistor formed thereto according to a fifth embodiment of the present invention.

FIG. 10 is a top view of a semiconductor chip having a field-effect transistor according to a fifth embodiment. In this embodiment, as a substrate via-hole to ground the source electrode 15, one square source pad 51 is formed for every 5 source electrodes 12. The surface via-hole 2 is formed below the source pad 51. The surface via-hole 2 is circular shape of approx. 10 μm diameter. Even if a pattern of photolithography reticle is square, as the photoresist film is thick, an almost round shape pattern is formed to the photoresist film. In a dry etching process of the semiconductor chip 50, by a side etching near the corners of the photoresist film, the surface via-hole 2 is expanded with a round shape. By this, to the backside below the surface via-hole 2, a backside via-hole (not shown) is formed with several dozen μm diameter. For a blocking film (not shown) formed between the surface via-hole 2 and backside via-hole, metals of group 8 element is used as with the first embodiment.

For the surface via-hole 2 of approx. 10 μm diameter, the source pad 51 positioned thereabove is formed to have a rectangle shape with one side of approx. 20 μm. On the other hand, pads for wire bonding such as the gate pad 17 and drain pad 18 is formed to be a rectangle shape with one side of approx. 100 μm. Compared with the pad for wire bonding, the area of the source pad 51 is small. As it is not necessary to form the substrate via-hole for each source electrode 12, the pitch between source electrodes of the GaAsFET can be small.

Cellular phone, one of devices mounting a GaAsFET, does not require much output power of a high-frequency signal. However a high transconductance is required with low drain supply voltage. In such case, in order to increase the gate width of the GaAsFET, a large number of gate electrodes must be disposed to increase the gate width apparently. To form such GaAsFET, disposing the source pad 15 explained in this embodiment is extremely effective to reduce the chip area. The number of source electrodes 12 connected to one source pad 51 is configured with a consideration for an inductance, resistance and the like on a ground terminal. And the inductance and resistance configured according to a frequency band required for the GaAsFET and use of output power or the like.

Sixth Embodiment

Figure 11:
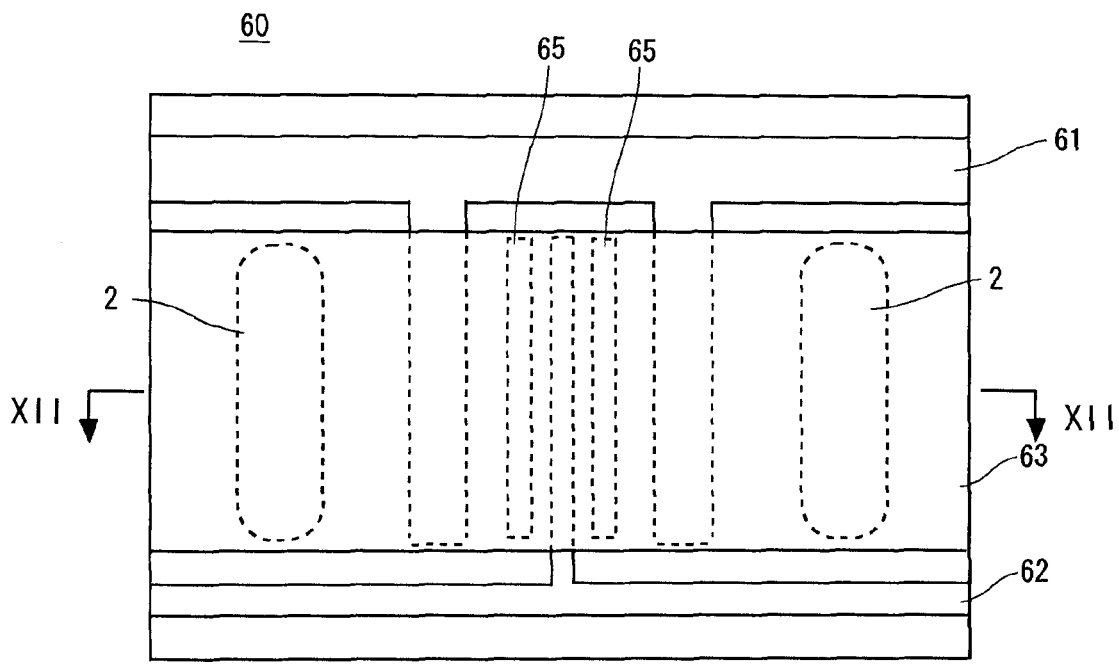
FIG. 11 is an enlarged top view illustrating the structure of a semiconductor device having a heterobipolar transistor according to a sixth embodiment of the present invention.
Figure 12:
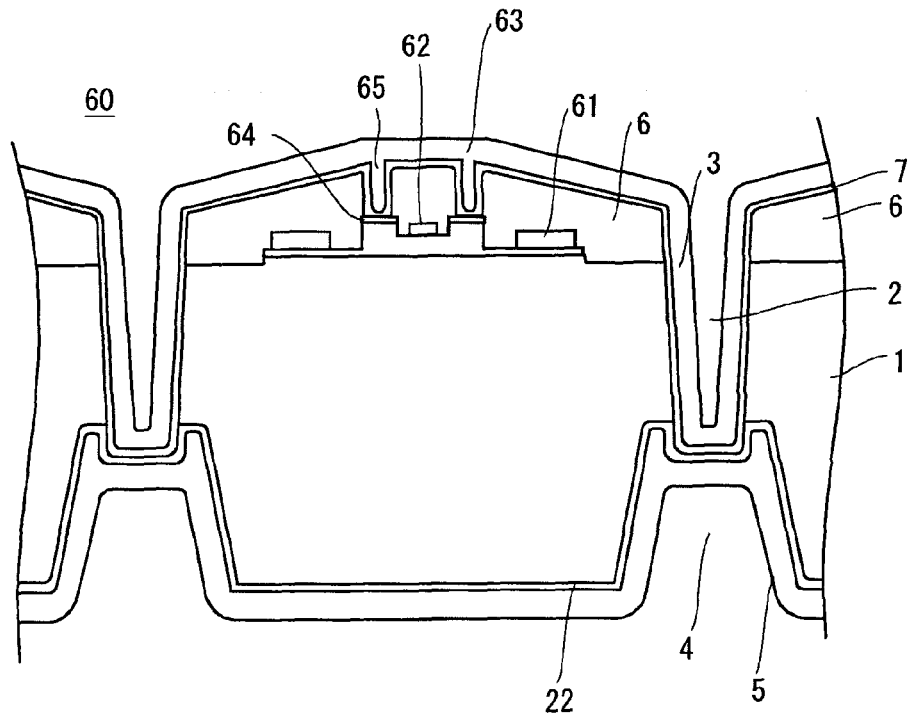
FIG. 12 is a cross-sectional diagram of the semiconductor device having the heterobipolar transistor according to the sixth embodiment of the present invention.

In the above embodiments, a semiconductor apparatus having a double-sided substrate via-hole has been explained with GaAsFET as an example. However the present invention is not limited to this. A semiconductor apparatus according to a sixth embodiment is a heterobipolar transistor (hereinafter simply referred to as HBT) formed over a GaAs substrate as a vertical transistor. FIG. 11 is a top view of a semiconductor chip 60 having a HBT formed thereto according to the sixth embodiment. FIG. 12 is a cross-sectional diagram of the semiconductor chip 60 having a HBT formed thereto according to the sixth embodiment. FIG. 12 is a cross-sectional diagram taken along the line XII-XII of FIG. 11. Basic structure concerning the substrate via-hole part is substantially same as the first embodiment.

An illustrative embodiment of a HBT is briefly described. A HBT epitaxially grows each kind of compound semiconductor layer to the surface of the GaAs substrate. Then each layer is etched to form an electrode. If the HBT is emitter top type, over the GaAs substrate, a sub-collector layer of highly concentrated n type GaAs, collector layer of low concentrated n type GaAs, base layer of highly concentrated p type GaAs, hetero-emitter layer of medium concentrated n type InGaP, contact layer of highly concentrated n type GaAs and cap contact layer of ultrahigh concentrated n type InGaAs are epitaxially grown.

An emitter electrode formed of heat-resistant metal is put in contact with the cap contact layer of ultrahigh concentrated n type InGaAs. As the layer is ultrahigh concentrated n type, an ohmic contact can be obtained without an alloying heat treatment. The cap contact layer and contact layer are processed by etching to leave an emitter region including the emitter electrode. A base electrode is deposited to the exposed n type InGaP hetero-emitter layer. By an alloying heat treatment and diffusing the base electrode in the hetero-emitter layer, an ohmic contact with the p type GaAs base layer therebelow is obtained. Leaving the base region including the base electrode and emitter electrode, an etching is performed to remove up to the collector layer of low concentrated n type GaAs. A collector electrode is formed to the exposed sub-collector layer of highly concentrated n type GaAs and an ohmic contact is obtained by an alloying heat treatment. The sub-collector layer is removed by etching to leave the HBT active region including the collector electrode. The HBT device formed consequently includes an electrode to each step of the step like shape.

The electrode in each step is collector, base and emitter from bottom. The shape and basic structure of the electrodes is described here. In these days, for higher performance, various kind of layer is inserted to each step and semiconductor composition can be changed.

FIG. 12 is a cross-sectional diagram focusing one HBT device on the surface side of the GaAs semiconductor substrate 1. For the HBT device, with one base electrode at the center, 2 emitter electrodes 64 and 2 collector electrodes are formed to the both sides. Firstly to the center of the HBT device, the base electrode (not shown) and a base line 62 connected thereto are formed. Above the both sides of the base line 62, a convex shaped emitter region is formed. The emitter electrode 64 is formed above the emitter region. The emitter line 63 is connected with the emitter electrode 64 via an emitter hole 65 of the insulating film 6. The collector electrode (not shown) and a collector line 61 connected thereto are formed away beside the emitter electrode 64 and the surface via-hole 2 formed to the semiconductor substrate 1 is formed further away. The emitter line 63 is formed to be trenched in the GaAs substrate 1 as the surface via line 3. As an illustrative embodiment of the HBT device, 1 emitter electrode, 2 base electrodes and 2 collector electrodes may be provided. For the HBT device, 2 emitter electrodes, 3 base electrodes and 2 collector electrodes may be provided.

As shown in FIG. 11, the HBT active region is formed to be rectangle with about 50 to 100 µm in longer direction. Each electrode is provided with strip shape with the length. The emitter line 63 is formed to cover the HBT device with this width. The emitter line 63 is connected with the emitter electrode 64 (not shown in FIG. 11) which is formed below the emitter hole 65 indicated by the dotted line. One base line 62 and 2 collector lines 61 get into the lower part of the emitter line 63 as indicated by the dotted line from one side each. Away from the HBT device, as indicated by the dotted line below the emitter line 63, an opening of the surface via-hole 2 is provided to be a rectangle. With the surface via-hole 2 as the center, a plurality of HBT devices is provided symmetrically.

As shown in FIG. 12, the portion of the substrate via-hole is substantially the same as FIG. 4 of the first embodiment. The thickness of the GaAs substrate 1 is approx. 150 µm. The width of the surface via-hole 2 on the surface side is approx. 10 µm and depth is approx. 70 µm. The width of the backside of the backside via-hole 4 is approx. 20 µm and depth is approx. 90 µm. The bottom of the surface via line 3 projects to the backside via-hole 4 for approx. 10 µm. The surface via-hole 2 is away from the collector line 61 (collector electrode) at the end of the HBT device for approx. 10 µm.

The emitter line 63 as the surface via line 3 is provided by a Ti layer of approx. 50 nm thickness, Pt layer of approx. 200 nm (0.2 µm) and Au layer of approx. 5 µm in this order. The Pt layer of group 8 element corresponds to the blocking film 7 in the drawings. The Ti layer is for adhesive and the portion exposed inside the backside via-hole 4 is removed by a dry etching in a process to form the backside via-hole. Note that the dry etching method to form the surface via-hole 2 and backside via-hole 4 is substantially the same as the method described in the first embodiment. To the entire backside of the GaAs substrate 1, the backside electrode 5 is formed. As the adhesive film 22, a Ti layer of approx. 100 nm thickness is formed. As the backside electrode 5, an Au layer of 5 µm thickness is formed. The backside electrode 5 is formed inside the backside via-hole 4 and deposited to be electrically connected with the bottom of the surface via line 3.

When mounting the semiconductor chip 60 to a package or the like, a soldering material such as AuSn is used to fix. As wetting characteristic of the AuSn soldering material with the Au film for the backside electrode 5 is preferable, the AuSn soldering material is formed inside the concave portion in the backside via-hole 4 and the concave portion is filled. Thereby heat radiation is ensured. The emitter line 63 functions to radiate heat from the HBT device to the backside through the substrate via-hole unit. The thickness of the Au layer is configured with consideration for not only an electric resistance but also thermal resistance concerning radiation performance.

The insulating film 6 formed to the surface of the HBT device is actually including a plurality of insulating films. Each electrode and each line connecting thereto are connected via a through-hole formed to the insulating films. Near the surface of the semiconductor, in order to protect the HBT device, an inorganic insulating film such as $SiO_2$ or SiN is used. On the other hand, for a purpose to lift the emitter line 63 away from the semiconductor surface to reduce parasitic capacitance, an organic insulating film with low permittivity such as polyimide and Benzocyclobutene (BCB) is used. Otherwise, it may be an air-bridge structure with the lower part of the line is in midair. To the surface of wiring on top, an insulating film such as SiN is provided to protect from moisture or the like.

Seventh Embodiment

Figure 13:
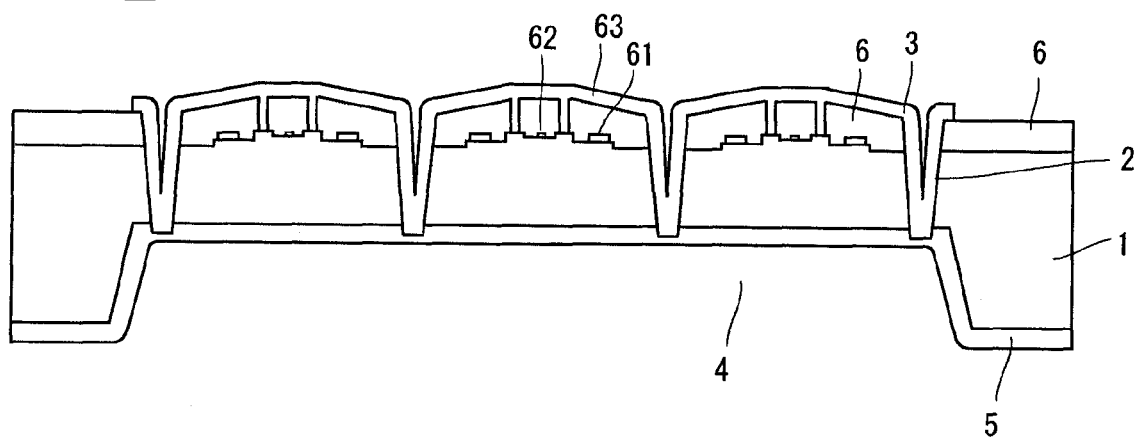
FIG. 13 is a cross-sectional diagram of a semiconductor device having a heterobipolar transistor according to a seventh embodiment of the present invention.

For a HBT device, one backside via-hole needs not to corresponds to one surface via-hole. FIG. 13 is a cross-sectional diagram of a semiconductor chip 70 having a heterobipolar transistor formed thereto according to a seventh embodiment. As shown in FIG. 13, the backside via-hole 4 on the bottom side of a group of HBT devices can be common. This is substantially the same as the second embodiment shown in FIG. 6.

As the substrate below the HBT device is thin, when soldering metal is formed inside the backside via-hole 4 and fill it, radiation performance from the lower part of the HBT device also improves. From the emitter line 63 on the surface side, heat is radiated to the backside electrode 5 side through the surface via line 3. However, as mechanical strength of the semiconductor chip 80 is reduced, the mechanical strength must be ensured by providing an area with thick substrate in the periphery of the backside via-hole 4.

Eighth Embodiment

In the abovementioned embodiments, the entire backside surface is metal so as to fix to the package by soldering. However in these days, it has been attempted that a plurality of terminal pads and ground plane acting as heat sink for cooling are provided to the backside of a semiconductor chip to directly mount the backside of the semiconductor substrate to a circuit substrate. In such case, from a circuit group on the surface, a connection must be made with the terminal pad on the backside through a via-hole penetrating the substrate and the double-sided substrate via-hole of the present invention effectively contributes. In this embodiment, a semiconductor chip is described having many terminal pads provided to the backside of the semiconductor chip to directly mount to a circuit board.

Figure 14:
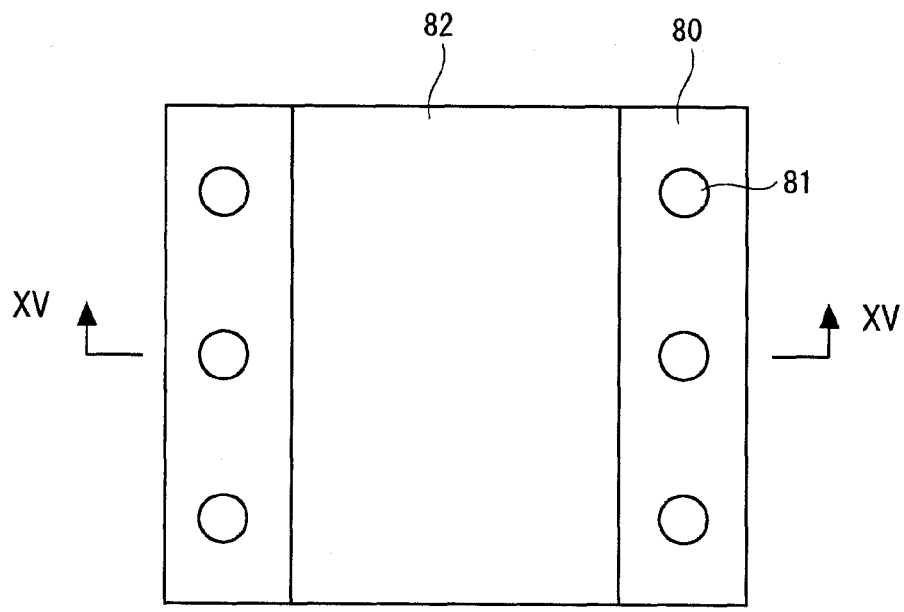
FIG. 14 is a backside view of a semiconductor chip according to an eighth embodiment of the present invention.
Figure 15:
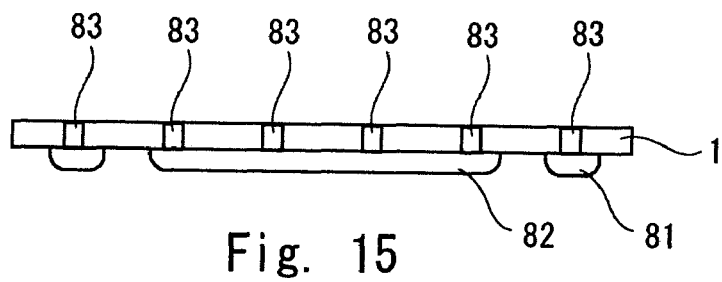
FIG. 15 is a cross-sectional diagram of the semiconductor chip according to the eighth embodiment of the present invention.
Figure 16:
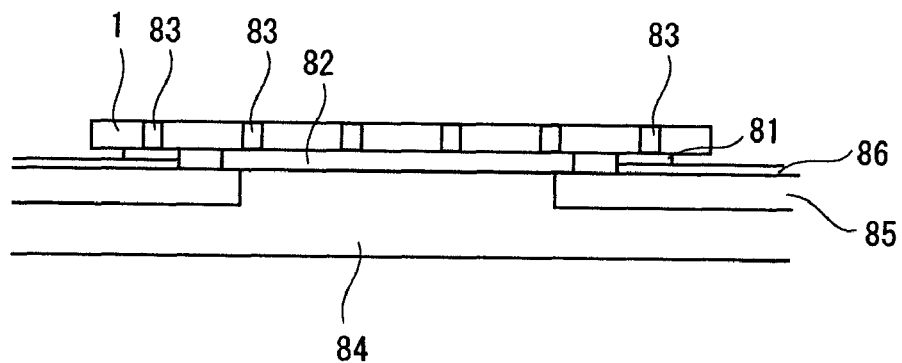
FIG. 16 is a cross-sectional diagram when the semiconductor chip is mounted according to the eighth embodiment of the present invention.
Figure 17:
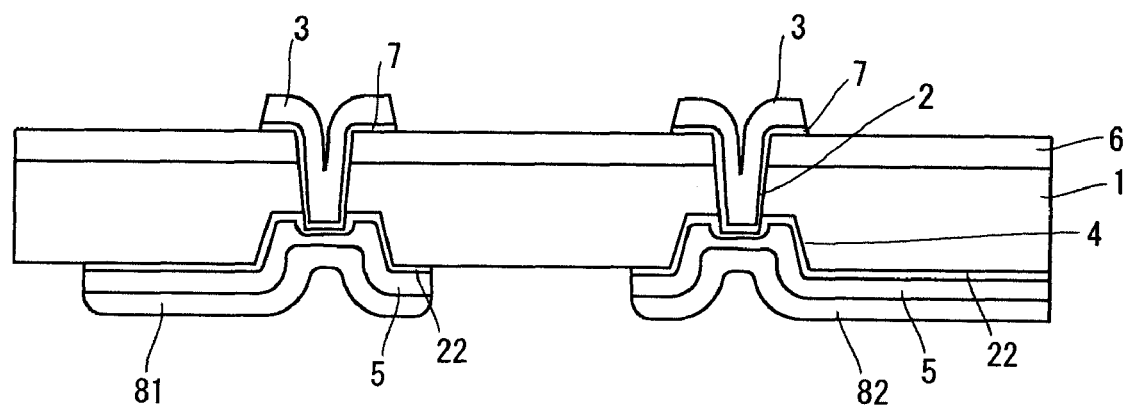
FIG. 17 is an enlarged cross-sectional view having the semiconductor chip formed thereto according to the eighth embodiment of the present invention.

A general illustrative embodiment of such semiconductor apparatus is described hereinafter. FIG. 14 is a backside view showing the configuration of the semiconductor chip according to an eighth embodiment. FIG. 15 is a cross-sectional diagram showing the configuration of the semiconductor chip according to the eighth embodiment. FIG. 15 is a cross-sectional diagram of the semiconductor apparatus taken along the line XV-XV of FIG. 14. FIG. 16 is a cross-sectional diagram showing an implementation of the semiconductor chip according to the eighth embodiment. FIG. 17 is an enlarged cross-sectional diagram showing the configuration of the semiconductor chip according to the eighth embodiment.

As shown in the backside view of FIG. 14, there is a ground pad 82 in the central part of a semiconductor chip 80. The ground pad 82 acts as an electrical grounding and heatsink for cooling. In the periphery, a terminal pad 81 is provided, which has been disposed over the surface in the related art. In FIG. 14, the terminal pad 81 is provided to opposing 2 sides. A large number of terminals may be provided to all the 4 sides and a rectangle ground plane may be provided inside.

As shown in the cross-sectional diagram of FIG. 15, a group of semiconductor devices (not shown) or a circuit group (not shown) thereof is disposed to the surface side above the ground pad 82 of the backside. To be grounded, they are connected with the ground pad 82 through the substrate via line 83 in the substrate via-hole. A terminal correspond to a terminal pad which has been disposed to the surface in related art is connected to the terminal pad 81 on the backside through the substrate via line 83.

FIG. 16 shows the cross-section when the semiconductor chip 80 is mounted. The ground pad 82 is fixed to a metal mount 84 corresponding to the pattern by soldering or the like. On the other hand, the area not corresponding to the ground pad 82 for the metal mount 84 is trenched to form an insulating layer 85. A metal line 86 is formed to the surface and connected with the terminal pad 81 by soldering or the like. Here the metal line 86 may be a microstrip line through the insulating layer 85 with the metal mount 84 as a ground plane. The metal mount 84 may be mounted to a mold or ceramic substrate.

The embodiment is described hereinafter with reference to FIG. 17. FIG. 17 is a cross-sectional diagram enlarging the part where the terminal pad 81 and ground pad 82 are formed in FIG. 14. Most part of FIG. 17 is substantially same as FIG. 4 in the first embodiment. A difference is that the backside electrode 5 is not provided to the entire surface but provided as isolated patterns such as to the terminal pad 81 and ground pad 82. As the adhesive film 22, a Ti of approx. 100 nm thickness is provided to the backside. An Au plating of approx. 5 μm is deposited to the backside electrode 5 by sputtering. Furthermore, several dozen μm of AuSn as a soldering material is mounted to be the terminal pad 81 and ground pad 82. The depth of the backside via-hole 4 is approx. 100 μm. The backside via-hole 4 cannot be completely buried by the soldering material AuSn of several dozen μm thickness. Thus the terminal pad 81 is pulled out to the backside planar portion to obtain adhering surface.

Au or AuSn soldering material may be adhered to the metal line 86 attached to the metal mount 84 shown in FIG. 16. In such case, the semiconductor chip 80 is held down in a nitrogen atmosphere with reduced oxygen and heated at 400 to 500 degrees Celsius. This softens the soldering material AuSn to solder. As the soldering material AuSn has preferable wetting characteristic with Au, soldering can be performed unfailingly.

For low cost products, Au cannot be used often. In such case, Cu wiring material and tin (Sn) high-temperature soldering not including Au are used. By using generally known flux material together, an oxide film on the surface can be removed to prevent oxidization in order to solder. To bond pad, a paste material including Ag, Cu or conductive particles such as conductive carbon may be used instead of soldering material.

Ninth Embodiment

In the above explanation, the substrate 1 is explained with a compound semiconductor GaAs device as an example. However this is not limited to GaAs. To dry etch each kind of semiconductor, chlorine or bromine gas is used for etching gas. Therefore, the present invention is effective to an apparatus using various semiconductors. A compound semiconductor can obtain resistivity of $1 \times 106\Omega cm$ or more for a substrate of a semi-insulating or a substrate having high resistance. However silicon (Si) which is a common semiconductor has low resistance. Silicon has about most only several k106 cm ($103\Omega cm$). Furthermore, Si may be doped to p type and has further low resistivity. Therefore, as in the eighth embodiment, when providing the terminal pad 81 to the backside by the via line 3 penetrating the substrate 1, the via line must be isolated from the Si substrate. Note, when the entire backside is grounded by the Si substrate, there is an aim to ground utilizing that the resistivity of the substrate is low. So, the substrate via line to be grounded is not required to be isolated from the Si substrate.

In this embodiment, the semiconductor substrate 1 of the eighth embodiment is changed to a Si substrate. A manufacturing method of the semiconductor apparatus having a plurality of substrate isolated from the Si substrate via lines penetrating the substrate 1 is described hereinafter. FIGS. 18A to 18F are cross-sectional diagrams illustrating a manufacturing process of a double-sided substrate via-hole unit using a conductive Si substrate according to the ninth embodiment.

Figure 18A:
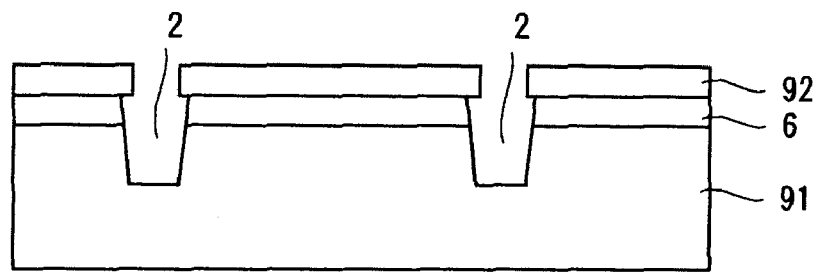
FIGS. 18A to 18F are cross-sectional diagrams showing a manufacturing process of a double-sided substrate via-hole unit using a conductive Si substrate according to a ninth embodiment of the present invention.

As shown in FIG. 18A, firstly a semiconductor device (not shown) such as CMOSFET or bipolar transistor and a multilayer interconnection (not shown) is formed to the surface of a Si wafer substrate 91. An insulating film 6 such as $SiO_2$ and SiON is provided. A photoresist film 92 having an opening pattern is provided to the surface of the insulating film 6. An opening is provided to the insulating film 6 by a dry etching such as RIE. The Si substrate 91 is trenched by a dry etching to form the surface via-hole 2. The thickness of the Si wafer substrate 91 is approx. 650 μm and the depth of trench is for approx. 100 μm.

Figure 18B:
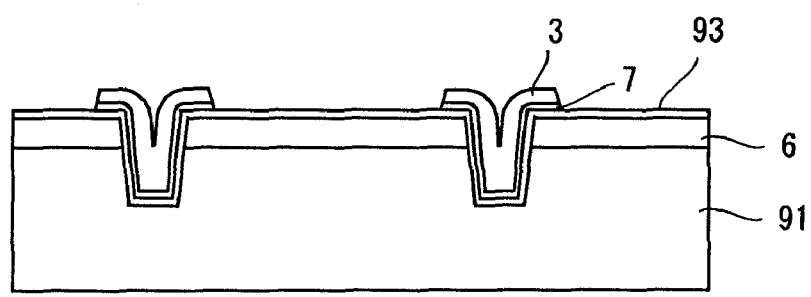

As shown in FIG. 18B, the photoresist film 92 is removed. An insulating film 93 of SiON or the like with 1 μm thickness is deposited. Then the inside of the surface via-hole 2 is covered. Furthermore, a Ti film with thickness of approx. 100 nm, Ni film with thickness of approx. 300 nm and Cu film with thickness of approx. 200 nm are deposited by sputtering. Next, Cu plating to be wiring with thickness of approx. 5 μm is selectively formed with a mask such as photoresist. Outside the wiring is removed by etching such as ion milling to form the surface via line 3. In this embodiment, an Ni film is used as the blocking film 7. Forming this line, lines for power feeding for top layer or the like is also formed. To protect the surface, an insulating film of SiON or the like and polyimide (not shown) with 10 μm thickness are formed to the surface of the surface via line 3. In the circuit of main unit, a pad opening on the surface side is not necessary. An opening is provided as necessary to a terminal pad of a monitor TEG on the surface side.

Figure 18C:
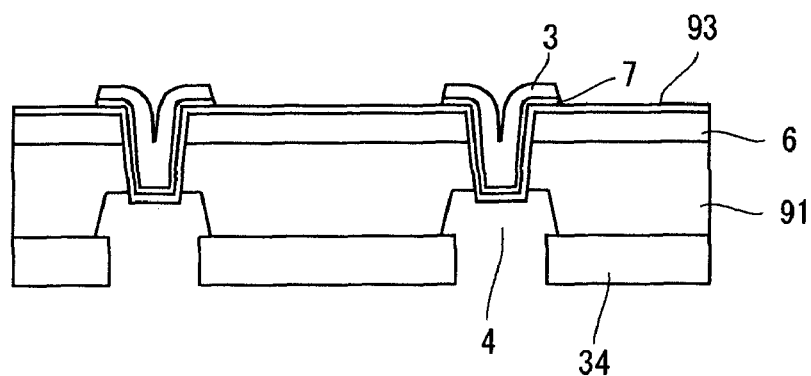

As shown in FIG. 18C, the backside of the Si substrate 91 is polished to reduce the thickness from approx. 650 μm to approx. 200 μm. For a Si substrate, strength can be ensured even with approx. 200 μm thickness, thus it is not necessary to use a glass plate or the like to reinforce. A photoresist film 94 having an opening pattern is provided to the backside of the Si substrate 91. The backside of the Si substrate 91 is trenched for 130 μm by dry etching to provide the backside via-hole 4. The bottom of the surface via line 3 is exposed for approx. 30 μm to the inner side of the backside via-hole 4. If the insulating film 93 such as SiON that is deposited inside the surface via-hole 2 remains and the bottom of the surface via line 3 is not exposed, RIE is added by fluorine (F) gas to remove the film.

Figure 18D:
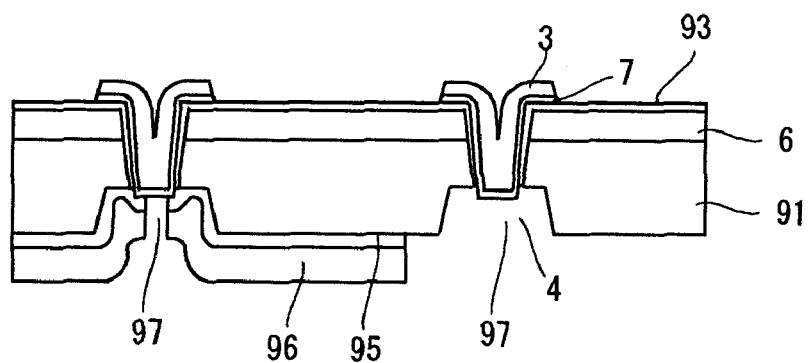

As shown in FIG. 18D, an insulating film 95 such as SiON is deposited by CVD with approx. 1 μm thickness to the backside of the Si substrate 91. At this time, the insulating film 95 is also formed inside the backside via-hole 4. The insulating film 95 is formed into the gap between the surface via-hole 2 generated by an over-etching to the insulating film 93 on the surface side.

A thin photoresist film 96 having an opening pattern is provided. A RIE of fluorine gas is performed. This creates openings 97 in the insulating film 95. To the side corresponding to the right ground pad 82, an opening is formed with 5 μm smaller than the shape of the ground pad 82. On the other hand, to the side corresponding to the left terminal pad 81, an opening is provided to be inner side of the bottom of the surface via line 3. For example, if the width of the bottom is 10 μm, the opening is formed to be about 5 μm. The photoresist film 96 used to form an opening preferably has low viscosity. And the photoresist film 96 is preferably thin within about 1 μm. This is because that the photoresist film will not be accumulated much and not too thick inside the backside via-hole 4 and the opening pattern can be exposed.

Figure 18E:
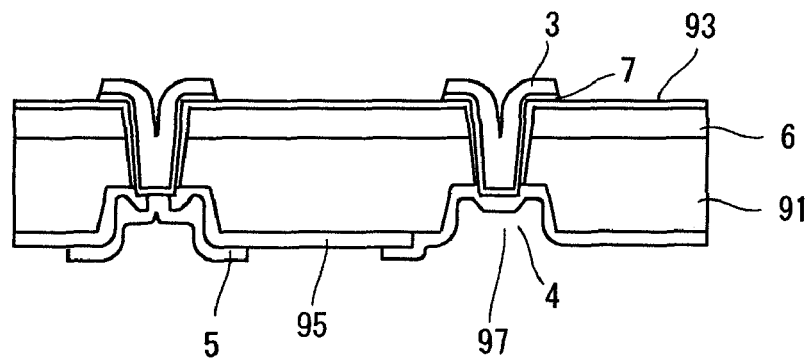
Figure 18F:
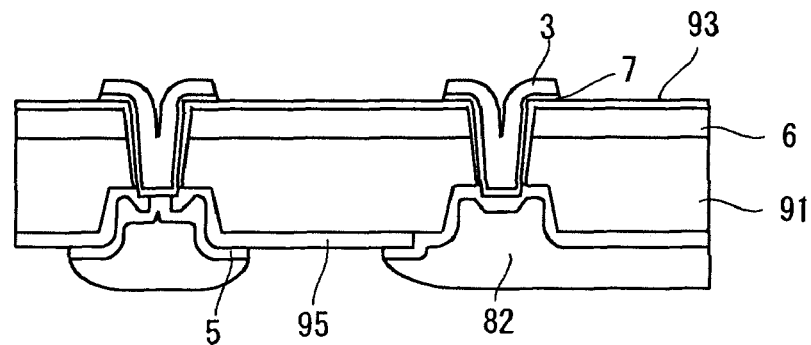
Figure 19A:
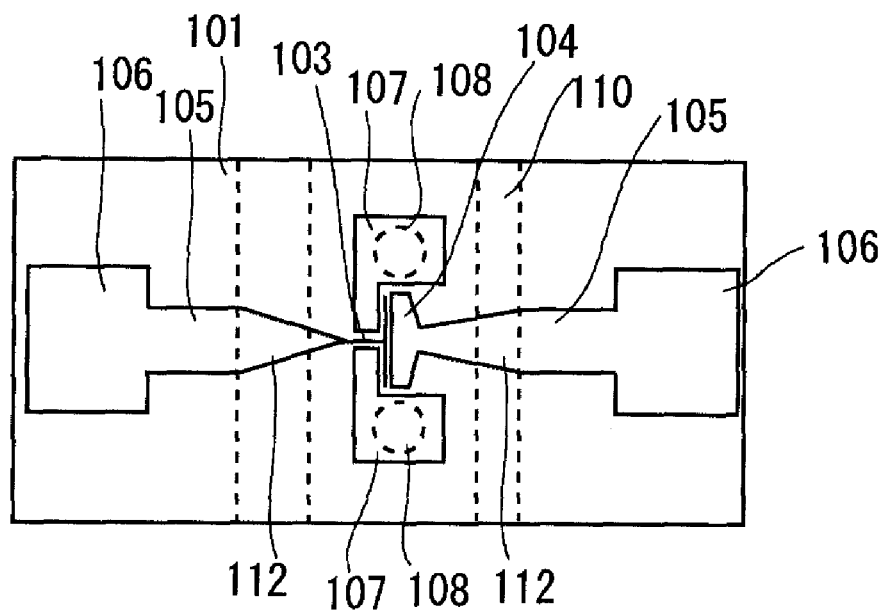
FIGS. 19A and 19B are top view and cross-sectional diagram showing the configuration of a field-effect transistor according to a related art 1.
Figure 19B:
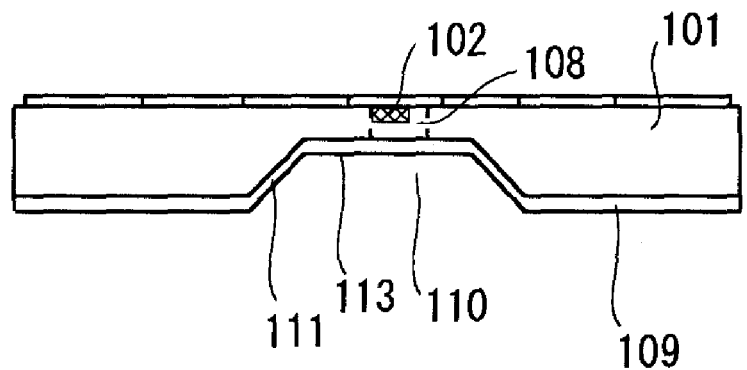
Figure 20A:
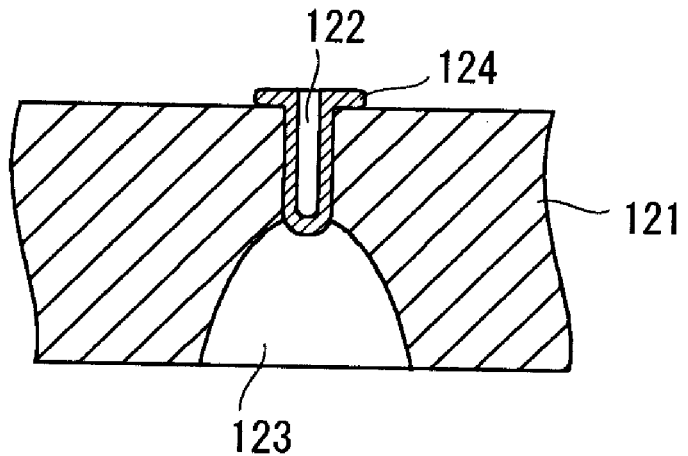
FIGS. 20A to 20D are cross-sectional diagrams showing a manufacturing method of a double-sided substrate via-hole unit according to a related art 2.
Figure 20B:
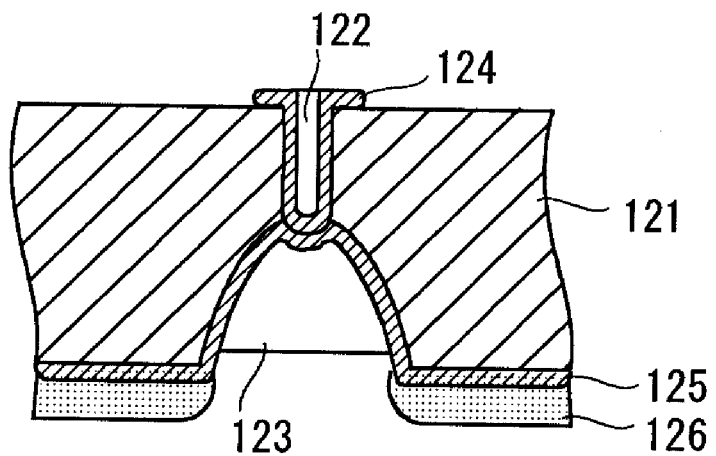
Figure 20C:
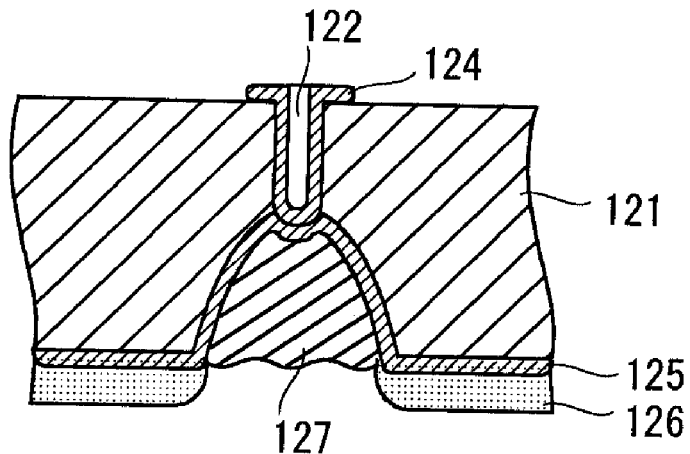
Figure 20D:
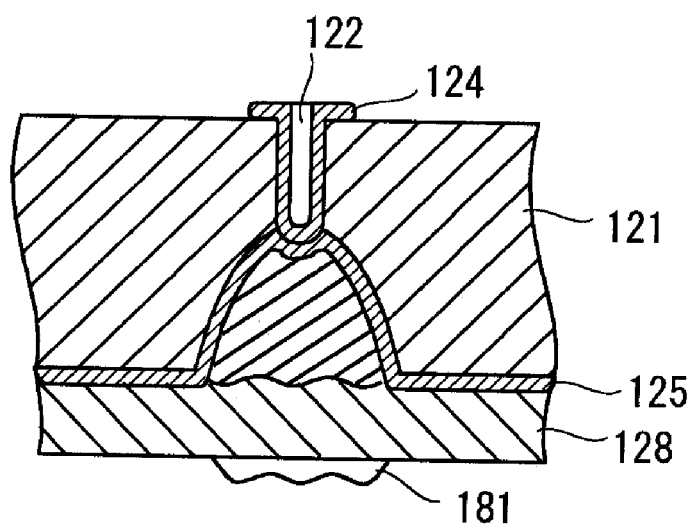
Figure 21A:
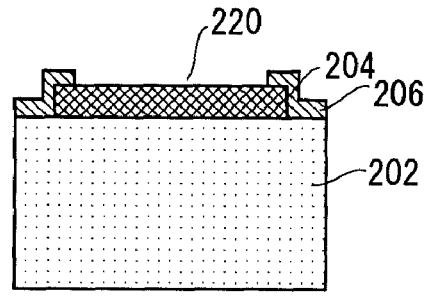
FIGS. 21A to 21E are cross-sectional diagrams showing a manufacturing method of a double-sided substrate via-hole unit according to a related art 3.
Figure 21B:
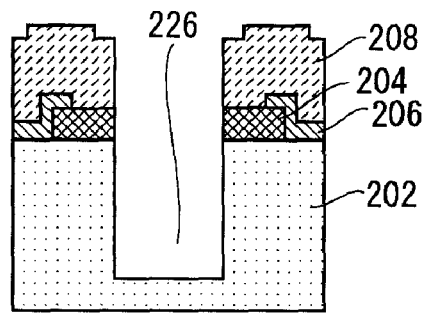
Figure 21C:
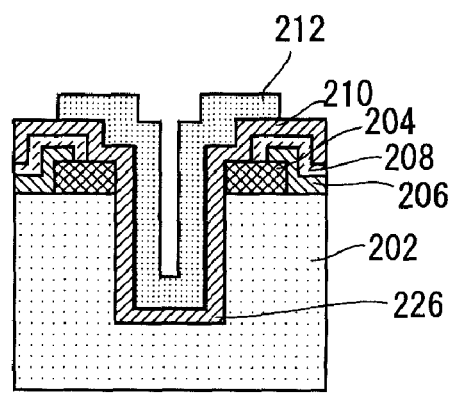
Figure 21D:
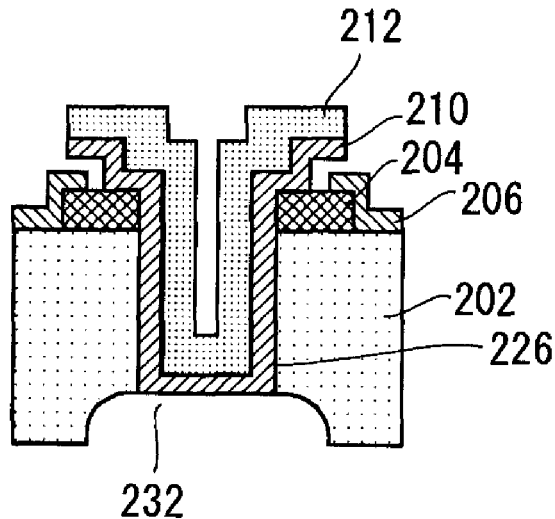
Figure 21E:
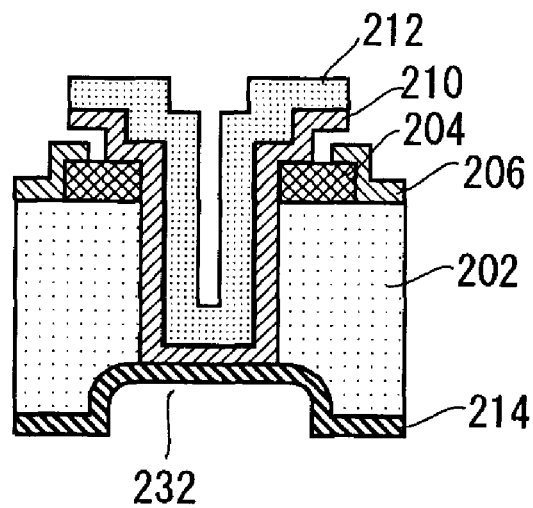

As shown in FIG. 18E, in each of the backside via-holes 4, the backside electrode 5 is provided to be electrically connected with the surface via lines 3. For example, Ti, Ni and Cu are sequentially deposited to selectively give Cu plating and unnecessary metal region is removed by etching. Next as shown in FIG. 18F, Sn soldering material is mounted for several dozen μm to the backside electrode 5. So the terminal pad 81 and ground pad 82 is formed to the backside electrode 5. By such a series of manufacturing method, the terminal pad 81 is isolated from the Si substrate by the insulating film.

For the semiconductor apparatus having the double-sided substrate via-hole according to one of this invention, the blocking film 7 of metals of group 8 element such as Pt and Ni is formed inside the surface via-hole 3. This prevents from etching to the via line on the surface side by a dry etching using chlorine gas to form the backside via-hole 4. A conductivity of the via line to the backside of the semiconductor substrate 1 is steadily obtained. Furthermore, the blocking film 7 remains in the boundary of the substrate via-holes from both sides. However the blocking film 7 is made of group 8 element. So, group 8 element is all metal and has low resistance. Hence a favorable electric connection can be obtained.

It is apparent that the present invention is not limited to the above embodiments but may be modified and changed without departing from the scope and spirit of the invention.

What is claimed is:

1. A semiconductor apparatus comprising:
    a semiconductor device formed to a first surface of a semiconductor substrate;
    a blocking film provided in a first via-hole, the first via-hole formed with a concave shape to the first surface of the semiconductor substrate;
    a first via line, in contact with the blocking film, that is connected to an electrode of the semiconductor device in contact with the blocking film;
    a second via line formed inside a second via-hole, electrically connected with the first via line with the blocking film interposed therebetween and being a part of a wiring formed to a second surface, the second via-hole formed with a concave shape to the second surface opposing the first surface of the semiconductor substrate so as to reach the blocking film,
    wherein the blocking film includes at least one kind of group 8 element and is formed as being projected to the second via-hole.

2. The semiconductor apparatus according to claim 1, wherein the semiconductor substrate is Si, GaAs, InP, GaN or SiC.

3. The semiconductor apparatus according to claim 1, wherein the blocking film includes at least one kind of group 8 element; iron (Fe), cobalt (Co), nickel (Ni), ruthenium (Ru), rhodium (Rh), palladium (Pd), osmium (Os), iridium (Ir) and platinum (Pt).

4. The semiconductor apparatus according to claim 1, wherein one of the first via line is in contact with one of the second via line.

5. The semiconductor apparatus according to claim 1, wherein a plurality of the first via lines are in contact with one of the second via line.

6. The semiconductor apparatus according to claim 1, wherein the second via line is provided to a lower part of the semiconductor device formed to the first surface.

7. The semiconductor apparatus according to claim 1, wherein the second via line is provided to have a sloped sidewall to the lower part of the semiconductor device formed to the first surface.

8. The semiconductor apparatus according to claim 1, wherein the first and the second via lines are metal, metal alloy or resin with diffused conductive particles.

9. The semiconductor apparatus according to claim 1, wherein the wiring formed to the second surface is formed to an entire surface of the second surface.

10. The semiconductor apparatus according to claim 1, wherein the wiring formed to the second surface is a plurality of the second via lines disposed separately.

11. The semiconductor apparatus according to claim 1, wherein the first and the second via lines are in contact with each other, the semiconductor substrate and an insulating layer interposed therebetween.

12. The semiconductor apparatus according to claim 1, wherein the semiconductor device is a field-effect transistor or a bipolar transistor.

13. The semiconductor apparatus according to claim 1, wherein the blocking film is formed along a shape of a sidewall and a bottom of the first via-hole.

14. The semiconductor apparatus according to claim 1, wherein the second via line includes a Ti layer as an adhesive film and an Au layer as a conductive film in order from a side of the first via line.

* * * * *

UNITED STATES PATENT AND TRADEMARK OFFICE
CERTIFICATE OF CORRECTION

PATENT NO.        : 7,834,461 B2
APPLICATION NO.   : 11/853196
DATED             : November 16, 2010
INVENTOR(S)       : Shuji Asai et al.

It is certified that error appears in the above-identified patent and that said Letters Patent is hereby corrected as shown below:

Column 9, Line 45: delete "100nm." and insert -- 100μm. --
Column 22, Line 23: delete "1×106Ωcm" and insert -- 1×10$^6$Ωcm --
Column 22, Line 27: delete "k106 cm" and insert -- kΩcm --
Column 22, Line 27: delete "(103Ωcm)." and insert -- (10$^3$Ωcm). --

Signed and Sealed this
First Day of January, 2013

David J. Kappos
*Director of the United States Patent and Trademark Office*